United States Patent
Minneman et al.

(10) Patent No.: US 9,595,804 B2
(45) Date of Patent: Mar. 14, 2017

(54) SYSTEM AND METHOD OF DYNAMIC AND ADAPTIVE CREATION OF A WAVELENGTH CONTINUOUS AND PRESCRIBED WAVELENGTH VERSUS TIME SWEEP FROM A LASER

(75) Inventors: Michael Minneman, Lafayette, CO (US); Jason Ensher, Lafayette, CO (US); Dennis Derickson, Lafayette, CO (US); Michael Crawford, Lafayette, CO (US)

(73) Assignee: Insight Photonic Solutions, Inc., Lafayette, CO (US)

( * ) Notice: Subject to any disclaimer, the term of this patent is extended or adjusted under 35 U.S.C. 154(b) by 32 days.

(21) Appl. No.: 14/238,282

(22) PCT Filed: Jul. 21, 2012

(86) PCT No.: PCT/US2012/047770
§ 371 (c)(1),
(2), (4) Date: Jun. 6, 2014

(87) PCT Pub. No.: WO2013/016249
PCT Pub. Date: Jan. 31, 2013

(65) Prior Publication Data
US 2014/0307753 A1    Oct. 16, 2014

Related U.S. Application Data

(60) Provisional application No. 61/510,765, filed on Jul. 22, 2011.

(51) Int. Cl.
*H01S 3/10*    (2006.01)
*H01S 5/0625*    (2006.01)
(Continued)

(52) U.S. Cl.
CPC ............... *H01S 3/10* (2013.01); *H01S 5/062* (2013.01); *H01S 5/0654* (2013.01);
(Continued)

(58) Field of Classification Search
CPC ........ H01S 3/10; H01S 5/062; H01S 5/06256; H01S 5/0654; H01S 5/141; H01S 5/0617
See application file for complete search history.

(56) References Cited

U.S. PATENT DOCUMENTS 6,504,856 B1    1/2003    Broberg et al.
6,788,719 B2    9/2004    Crowder
(Continued)

FOREIGN PATENT DOCUMENTS

WO    99/40654 A1    8/1999
WO    WO 9940654 A1    8/1999
WO    WO 2010127151 A2 *    11/2010    ........... H01S 3/1305

OTHER PUBLICATIONS

International Preliminary Report on Patentability with Written Opinion, corresponding to application No. PCT/US12/047770, dated Jan. 28, 2014.
(Continued)

*Primary Examiner* — Yuanda Zhang
(74) *Attorney, Agent, or Firm* — Renner, Otto, Boisselle & Sklar, LLP

(57) ABSTRACT

A system (10, 20) and method including a wavelength tuning mechanism and a laser path length tuning mechanism for reducing discontinuities in a sweep range. A processor (14) is coupled to a wavelength monitoring device (18) and the tuning mechanisms. The processor analyzes data from the wavelength monitor to adjust the wavelength tuning and cavity length tuning at discontinuities in the wavelength sweep to reduce the discontinuities.

37 Claims, 15 Drawing Sheets

(51) Int. Cl.
*H01S 5/065* (2006.01)
*H01S 5/062* (2006.01)
*H01S 5/06* (2006.01)
*H01S 5/14* (2006.01)

(52) U.S. Cl.
CPC ........ *H01S 5/06256* (2013.01); *H01S 5/0617* (2013.01); *H01S 5/141* (2013.01)

(56) References Cited

U.S. PATENT DOCUMENTS

| | | |
|---|---|---|
| 6,826,206 B1 | 11/2004 | Andersson |
| 6,868,100 B2 | 3/2005 | Larson et al. |
| 7,430,227 B2 | 9/2008 | Schubert et al. |
| 7,468,997 B2 | 12/2008 | Jayaraman |
| 7,732,784 B2 | 6/2010 | Shimizu et al. |
| 2002/0009108 A1 | 1/2002 | Kopylow et al. |
| 2002/0191651 A1 | 12/2002 | Funakawa et al. |
| 2003/0147442 A1* | 8/2003 | Larson et al. ............... 372/50 |
| 2004/0008743 A1* | 1/2004 | Nishimura et al. ........... 372/32 |
| 2006/0182157 A1* | 8/2006 | Bollenz ................ H01S 5/0687 372/32 |
| 2008/0043227 A1* | 2/2008 | Minneman et al. .......... 356/213 |
| 2012/0106579 A1* | 5/2012 | Roos .................... H01S 3/1305 372/20 |

OTHER PUBLICATIONS

International Search Report with Written Opinion, corresponding to application No. PCT/US12/047770, dated Aug. 3, 2013.

\* cited by examiner

SYSTEM AND METHOD OF DYNAMIC AND ADAPTIVE CREATION OF A WAVELENGTH CONTINUOUS AND PRESCRIBED WAVELENGTH VERSUS TIME SWEEP FROM A LASER

This application is a national phase of International Application No. PCT/US12/47770 filed Jul. 21, 2012 and published in the English language.

RELATED APPLICATION DATA

This application claims the benefit of U.S. Provisional Application No. 61/510,765, filed Jul. 22, 2011, which is hereby incorporated in by reference.

TECHNICAL FIELD

The present invention relates generally to an apparatus and a method to make the wavelength versus time sweep of a tunable laser continuous, monotonic and prescribed to a specific temporal profile for improved performance of systems using a swept tunable laser, such as optical coherence tomography (OCT), optical frequency domain reflectometry (OFDR), spectroscopy, remote sensing and testing of optical components.

BACKGROUND

In applications that use wavelength or frequency sweeps of lasers, there are three characteristics needed to receive accurate information about the application: (1) the continuity and monotonicity of the wavelength sweep versus time; (2) the linearity of the sweep versus time; and (3) the ability to maintain continuity, monotonicity and linearity over time and environmental changes (such as temperature, humidity). For example, the shape of a molecular gas absorption feature may be distorted by a discontinuity—a forward or backward jump—in the wavelength sweep of the laser. In another example, wavelength discontinuities can reduce the quality of an OCT image of tissue. Thus, it is desirable to eliminate wavelength discontinuities from swept-wavelength lasers.

FIG. 1A illustrates a continuous linear frequency sweep of an ideal laser over time. FIG. 1B illustrates a continuous, but non-linear frequency sweep of an exemplary laser over time. FIG. 1C illustrates a discontinuous frequency sweep of an exemplary laser over time.

Wavelength discontinuities in single-mode, swept-wavelength lasers are often caused by sudden transitions from one single-longitudinal mode of the laser to another single-longitudinal mode, where the wavelengths of the modes are substantially different. These transitions are generally referred to as mode hops. Wavelength discontinuities may also occur in multi-mode, swept-wavelength lasers such as a Fourier Domain Mode Locked (FDML) laser and others when a sudden transition occurs between a group of modes of the laser to another group of modes of the laser, when the average wavelengths of the two groups are substantially different.

Even when the sweep is continuous and monotonic, in many applications it is advantageous for the laser wavelength to follow a specific temporal profile. For example, in OCT a sweep versus time that is linear in the optical frequency versus time is preferable to enable Fourier post-processing of the sweep data. In other applications, for example, OCT or telecommunications testing, it is advantageous to sweep the optical frequency versus time non-linearly versus time to compensate for other effects in a device or material under test.

Attempts in the prior art to reduce or eliminate mode hops and control the sweep profile are numerous, but generally unsatisfactory or temporary. Although it may be possible to carefully remove all discontinuities and non-linearity at a point in time, with the passage of time or changes in (for example) temperature will then create additional discontinuities and non-linearities. For example, external cavity lasers operate in near continuous single-mode using an external cavity mechanism coupled with a gain medium. Mode hops are prevented through accurate, tightly-toleranced components and precision alignment of the cavity, or using real-time elements such as piezoelectric transducers that adjust the cavity length in real-time.

Other laser configurations use an intra-cavity element. Over time, the alignment of the laser degrades or the components wear, which may cause mode hops and changes in the sweep profile versus time. As the ambient temperature or pressure change, the alignment can degrade, which can also cause mode hops and changes in the sweep profile versus time. Vibrations external to the laser or vibrations internal to the laser (due to high-speed mechanical operation) may also misalign the cavity, which again may cause mode hops and changes in the sweep profile versus time.

Another challenge is that mode hops may occur anywhere in the wavelength sweep of the laser with a mechanical tuning mechanism. Hence, there is a need to monitor the entire sweep for signs of wavelength discontinuities and changes in the sweep profile of a laser, and to correct the laser sweep for these changes.

Another class of single-mode laser for producing swept wavelengths is monolithically-constructed semiconductor lasers. Monolithic semiconductor lasers include several sections or segments in the semiconductor, which serve as adjustable cavity mirrors, laser gain, cavity phase and (optionally) external amplification. Examples are Vertical Cavity Surface Emitting Lasers (VCSELs), VCSELs with Micro-electromechanical systems (MEMS) tuning structures, Sampled Grating Distributed Bragg Reflector (SGDBR) lasers, Super-Structure Grating Distributed Bragg Reflector (SSGDBR) lasers and similar devices. Because these lasers are monolithic with no moving parts, their cavities are extremely stable and can operate in single-longitudinal mode with narrow linewidth and long coherence length. Tunable semiconductor lasers of this class require multiple laser current signals to tune the wavelength, presenting a challenge to creating wavelength sweeps without wavelength discontinuities. There is a need for an apparatus and method for controlling monolithic semiconductor lasers, reducing or eliminating mode hops within their wavelength sweeps and controlling their sweep profiles of wavelength versus time (to create, for example, linearity).

Monolithic tunable lasers with integrated gratings to enable tuning are now common in telecommunications applications. These tunable lasers are unique in that they offer wide wavelength tuning (for example 1520 to 1565 nanometers) and the capability for fast wavelength tuning (sweeps in microseconds) all on the same monolithic chip. Such a tunable laser will be referred to herein as a Semiconductor Monolithic Tunable Laser Source (SMTLS).

SMTLSs have wavelength regions associated with combinations of Back Mirror Drive and Front Mirror Drive. The complexity of the wavelength versus current map is shown in the FIG. 2. SMTLS devices were defined and developed to allow one of an array of specific wavelengths to be output, for example allowing selection of any one of the standard (ITU) wavelengths.

Work has been done in the past to allow fast switching of an SMTLS laser from one wavelength to another wavelength, anywhere in the tuning range of the laser, as discussed in U.S. Patent Application Publication 2009/0059972. Prior art involves using knowledge of the initial and final wavelength, and the currents associated with each wavelength, as well as feedback control systems to quickly lock the laser to its destination wavelength. This methodology is useful for applications in telecommunications that require discrete changes from one wavelength to another, destination wavelength.

SUMMARY

In other applications such as swept-wavelength test of telecommunications components, remote sensing and optical coherence tomography, there are many motivations to operate the laser not as a wavelength-switching device, but rather as a wavelength-sweeping device. A wavelength sweep, as used in this disclosure, refers to a continuous (or step-wise continuous) movement over time from one wavelength to another, preferably in a linear, monotonic fashion.

The first challenge to sweeping a SMTLS is to determine how to tune the multi-section laser structure in a continuous manner. Each section of the laser is controlled by a parameter such as current or voltage, leading to a complex multi-variable control space. By measuring the wavelength of the laser at a plurality of tuning currents (such as the front mirror, the back mirror and phase section of the laser) a continuous path can be determined that traverses from lower wavelength to higher wavelength. Tuning paths are illustrated by the discrete lines labeled (a-i) in FIG. 3. Starting on line labeled (a), a set of front and back mirror currents (and, not shown, phase currents) may be selected that tunes the laser continuously in wavelength from high wavelength to successively lower wavelengths along lines (b), (c), etc. to line (h), or from low optical frequency to higher optical frequency.

Each enclosed region in FIG. 3 represents a mode of the laser. At the boundary of each region, a mode hop occurs. As an example a mode hop in an SMTLS laser may be 350 picometers (pm) long. The magnitude of the mode hop may be controlled with the phase current. However, changing the phase current alters the details of the wavelength map in FIG. 3. Preventing wavelength discontinuities in an SMTLS requires understanding how to adjust multiple control parameters across the wavelength sweep of the SMTLS.

A further complication to creating and maintaining a wavelength sweep is that time and temperature affect the Tuning Map in meaningful amounts. This means that for precise tuning linearity, the Mirror Sweep Paths (MSPs) change over time. Over the time scale of one sweep (for example nanoseconds or microseconds) tuning currents may be selected such that the laser stays on a particular path for that sweep, but over longer time periods (minutes to hours), the same consistency does not hold. Therefore, the wavelength continuity of even a SMTLS must be corrected over time.

The traditional view of how to accomplish a continuous sweep is the "Complete Absolute Wavelength Map" approach. One approach to creating a continuous sweep is to map in detail the front and back mirror and phase excitations versus absolute wavelength, then use this detailed map to develop the Mirror Sweep Path to attain continuous and monotonic wavelength versus time results. However, this approach requires a very large number of data points to achieve high wavelength linearity precision, which is time-consuming. In general, absolute wavelength measurement requires relatively expensive equipment that requires seconds per measurement (for instance, wavelength meters or optical spectrum analyzers). Because of the wavelength drift in the laser due to temperature and aging, an absolute wavelength measurement process would need to be performed regularly, which means that the expensive absolute wavelength measurement equipment would need to be available in or as an adjunct to the system. The addition of absolute wavelength measurement instruments substantially increases the cost of the system. Moreover, the time required to perform a large number of regular absolute wavelength re-calibrations may be too long for many end-user applications.

In addition to the issues above, the entire sweep is in reality a dynamic operation, not a static one, nor even a sequence of static operations. For example, the signals coming from the digital-to-analog converter used to generate the electrical signals are subject to delays and settling time. The signal then flows to an electrical signal conditioner (for example, a voltage-to-current converter), which also imposes signal delay and settling times. The transmission lines for each of the signals to the laser itself has a signal delay and settling times. The laser itself has these same delays and settling times. Then, within the laser, imposing a change in current (or voltage) creates a change in the temperature of that segment of the laser, and with a delay and settling time, also imposes a change in the temperature of the other elements of the laser (due to the physical proximity of each of these elements to one another). Thus, the actual outcome of creating this dynamic system of signals that are sent to the laser are a very complicated combination of not only the set of signals at any one time (for example, 5 signals for a Verneir-Tuned Distributed Bragg Reflector (VT-DBR), but also a combination of these simultaneous signals and the combination of the signals which have preceded them. The way in which these signals, delays and settling times combine are considerably dependent on the temperature, humidity and other environmental factors, and on the aging of the components, and are thus not constant from one time to another.

One aspect of the invention relates to a sweeping laser system including: a laser source; a laser control unit operatively coupled to the laser source; a processor to configure the laser control unit to control the laser source in order to achieve adherence to a set of prescribed sweep performance characteristics.

Another aspect of the invention relates to a method for controlling a semiconductor laser source to output radiation over a range of wavelengths, the method including: outputting radiation from a semiconductor laser source over a range of wavelengths, wherein the semiconductor laser source is configured to receive an input signal to discreetly change the radiation over the range of wavelengths; detecting data associated with at least one physical property associated with the radiation over the range of wavelengths; processing the data and changing an input signal to the semiconductor laser source in order to achieve adherence to a set of prescribed sweep performance characteristics.

Another aspect of the invention relates to a sweeping laser system including: a wavelength tuning mechanism; a laser path length tuning mechanism, wherein the tuning mechanisms are configured to operate a laser source from one wavelength to another wavelength separated by greater than one mode of the laser cavity; one or more wavelength monitoring devices; and a processor coupled to the one or more wavelength monitoring devices and the tuning mechanisms; wherein the processor analyzes data from the wavelength or frequency monitor and adjusts the wavelength tuning and cavity length tuning at discontinuities in the wavelength sweep to reduce the discontinuities.

Another aspect of the invention relates to a method for reducing the wavelength discontinuities in a sweep of a tunable laser from a start wavelength to a stop wavelength, the method including: tuning a laser with one or more parameters to sweep the laser from an initial wavelength to a final wavelength; measuring the light from the laser with at least one wavelength measurement device; coupling data from the at least one wavelength measurement device to a processor; and processing the data to adjust the laser control parameters to reduce the wavelength discontinuities in the sweep to achieve adherence to a set of prescribed sweep performance characteristics.

Based on the multivariate optical amplitude feedback data at each point, inferences regarding the relative and absolute wavelengths can be ascertained, and the potentially complex relationship amongst the wavelengths at the points, the set of control currents that generate the wavelength at each intermediate point (or step) may be adjusted to reduce or eliminate mode hops in the sweep and produce the wavelength versus time profile that is desired in the sweep.

The sweep may include a control signal or signals varied over time, say as an analog signal, or alternatively as a table or array of control currents and wavelengths, readout successively over time. During the sweep, the laser control signals are set open-loop relative to the wavelength monitoring sensors.

A number of features are described herein with respect to embodiments of the invention; it will be appreciated that features described with respect to a given embodiment also may be employed in connection with other embodiments.

The invention includes the features described herein, including the description, the annexed drawings, and, if appended, the claims, which set forth in detail certain illustrative embodiments. These embodiments are indicative, however, of but a few of the various ways in which the principles of the invention may be employed.

DESCRIPTION

Figure 4:
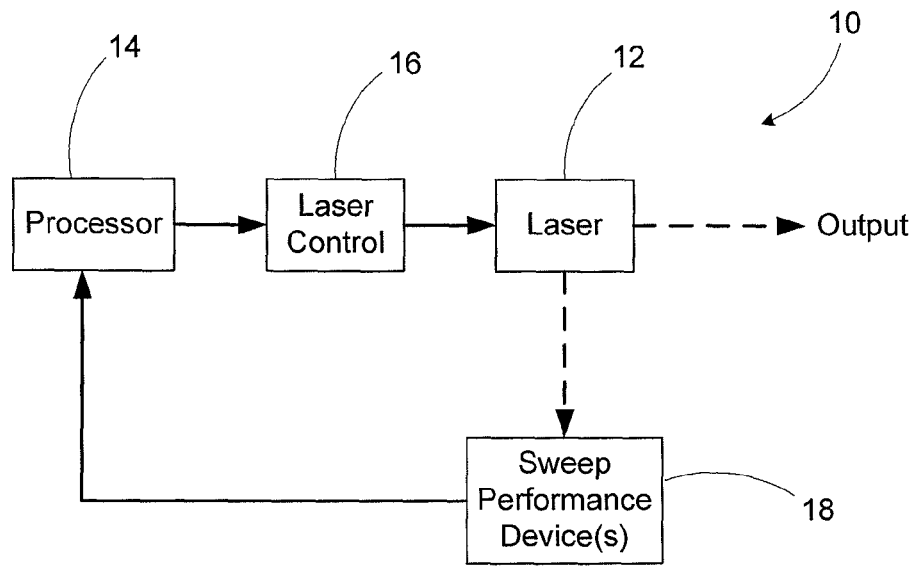
FIGS. 4-5 are exemplary systems in accordance with aspects of the present invention.
Figure 4:
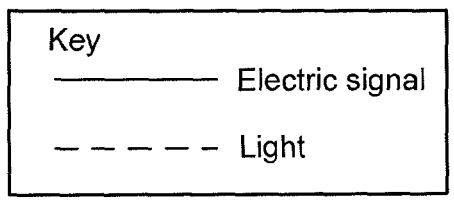

Referring to FIG. 4, aspects of the present invention are directed to a laser system 10 that includes a laser 12 that discreetly sweeps over a range of wavelengths (e.g., from a start wavelength to a stop wavelength). The laser 12 is configured to set output of the laser to a plurality of wavelengths between a range of wavelengths. The laser system 10 does not lock the control parameters to a wavelength reference at each intermediate wavelength during the sweep. Instead, the laser system 10 of the present invention uses a post-sweep feedback loop applied to the entire sweep wherein wavelength data from optical sensors such as interferometers and other sensors are measured at intermediate wavelengths in the sweep. Based on the multivariate optical amplitude feedback data at each point, inferences regarding the relative and absolute wavelengths can be ascertained, and the potentially complex relationship amongst the wavelengths at the points, the set of control currents that generate the wavelength at each intermediate point (or step) may be adjusted to reduce or eliminate mode hops in the sweep and produce the wavelength versus time profile that is desired in the sweep. For example, the relationship amongst the points (and not just the value at each point) is used to provide feedback for correction to eliminate mode hops. The sweep may include a control signal or signals varied over time, e.g., as an analog signal, or alternatively as a table or array of control currents and wavelengths, readout successively over time. During the sweep, the laser control signals are set open-loop relative to the wavelength monitoring sensors.

Laser System for Creating a Continuous, Monotonic, Prescribed Wavelength Sweep

An exemplary system 10 in accordance with aspects of the present invention is illustrated in FIG. 4. The system 10 includes a processor 14 that is coupled to a laser control unit 16 (also referred to herein as a laser controller). The laser control unit 16 couples control signals, for example electrical signals or command signals, to a laser source 12 (also referred to herein as a laser device). The laser 12 generates light in response to the laser controls. A portion of the light emitted by the laser source 12 is output for use. Another portion of the light emitted by the laser source 12 is coupled to one or more sweep performance monitor device(s) 18. The sweep performance monitor device(s) 18 may be one or more devices that are configured to determine an optical property associated with the output of the light from the laser source 12. The coupling to the sweep performance monitor device(s) 18 may be always maintained (e.g., constantly maintained from sweep to sweep) and/or maintained from time to time (e.g., periodically). The sweep performance monitor device(s) 18 generates signal or data in response to the wavelength or other properties of the laser. One or more of the sweep performance monitor device(s) 18 may be coupled to the processor 14, which may analyze the data or signals for adjusting the laser controls to adjust the performance of the laser source 12 for the purpose of reducing or eliminating wavelength discontinuities in a sweep of the laser device's wavelength versus time [for subsequent sweeps]. The adjustments may also modify the time-dependence of the laser wavelength sweep versus time. In a preferred embodiment, the laser wavelength sweep may be linear in optical frequency versus time.

Certain embodiments of the invention may apply to lasers that operate in a single-longitudinal mode of the laser cavity during the wavelength sweep. Examples of such lasers may be external cavity diode lasers, configured in a Littrow or Littman Metcalf configuration. Other embodiments may use a laser with an intra-cavity tuning element, such as a tuning Fabry-Perot filter or a combination of such elements. In all embodiments of the invention, at least two control parameters adjust the cavity wavelength and optical cavity length.

Laser System for Creating a Continuous, Prescribed Wavelength Sweep of an SMTLS

Figure 5:
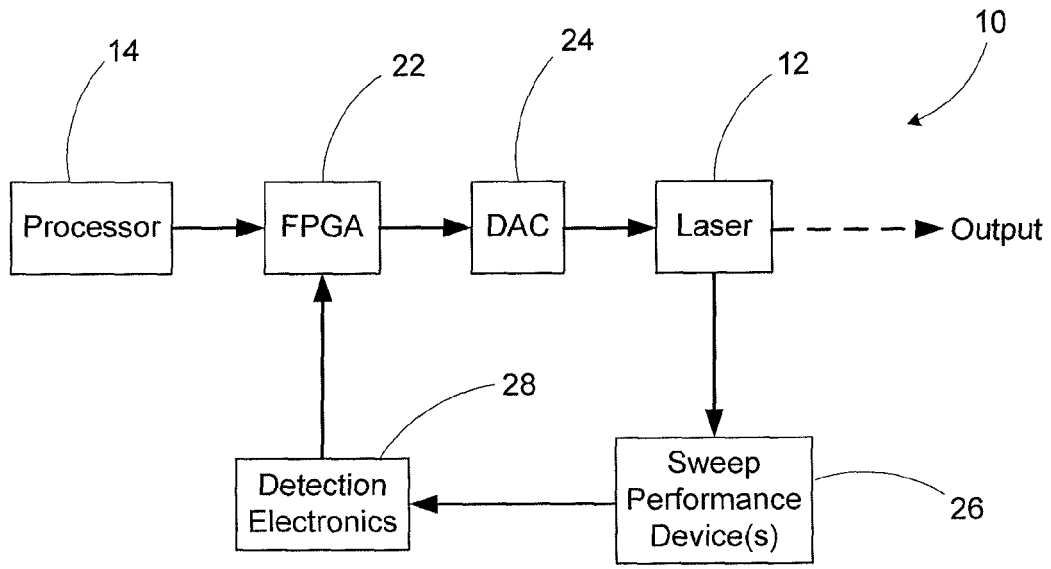

An alternative embodiment of a laser system 20 of the present invention is shown in FIG. 5. The processor 14 is coupled to a real-time digital processing device (DSP) 22 such as a Field Programmable Gate Array (FPGA), or an ASIC, for example. The DSP 22 is coupled to a Digital-to-Analog Converter (DAC) 24, which converts digital information from the DSP 22 (e.g., FPGA) into analog electrical signals. The DAC 24 electrical signals are the laser control signals that couple to the laser source 12. The laser source 12 may be an SMTLS. A portion of the light from the laser source 12 is output from the laser system. Another portion of the light from the laser device may be coupled to a wavelength monitor device 26 (alternatively, the coupling of the light to the wavelength monitor may only be active a portion of the time). The sweep performance monitor device(s) 26 may be identical to the sweep performance monitor device(s) 18 set forth above. Signals from the sweep performance monitor device(s) 26 may be coupled to detection electronics 28, which may detect the signal, amplify them or convert them from optical signals to electrical signals. The detection electronics 28 couple the data to the digital signal processor (DSP) 22, which is capable of rapidly acquiring the data. The processor may access the detected signal data from the DSP 22 to analyze the data or signals for adjusting the laser controls to adjust the performance of the laser device 10 for the purpose of reducing or eliminating wavelength discontinuities in a sweep of the laser device's wavelength versus time. The adjustments may also modify the time-dependence of the laser wavelength sweep versus time. In an illustrative embodiment, the laser wavelength sweep may be linear in optical frequency versus time.

In an illustrative embodiment of this invention the laser system 20 includes a multi-section tunable laser, such as a SMTLS. The sweep performance monitoring device(s) 26 may include optical interferometers and absolute wavelength references to measure the wavelength of the laser source 12 during a sweep. The sweep performance monitoring device(s) 26 may include an interferometer or etalon with a Free Spectral Range (FSR) larger than the maximum mode hop or wavelength drift of the laser, to provide a feedback signal to detect wavelength jump-shifts at the end of each mirror tuning segment and at the transition from one single-longitudinal mode of the laser to another while the phase section current is tuned. Additional sweep performance monitoring device(s) 26 may be the transmission of light through an absolute wavelength reference such as a gas cell or temperature stabilized Fabry-Perot etalon or Fiber Bragg gratings. Yet another sweep performance monitoring device(s) 26 may be an interferometer with an FSR that is short relative to the wavelength features of interest to the end-user, to provide precise wavelength linearity.

The above approach applies to sweeping tunable lasers. The approach may be most applicable when the selected sweep parameters (e.g. sweep rate, sweep speed, sweep start) are used for multiple, sequential sweeps (or where these parameters are at least substantially similar). Data from sweep performance monitoring device(s) 26, such as optical interferometers or gas cells, may be analyzed after each sweep. A post-sweep analysis of the sweep data enables the processor 14 to determine how to adjust each point in the sweep for the purpose of creating a user-specified sweep of wavelength versus time. Such a sweep may preferably encompass a single longitudinal mode, but alternatively may encompass multiple modes.

An aspect of this invention is the use of post-facto sweep parametrics to analyze the complex relationship between all the points in the sweep, to alter the tuning parameters for the next sweep. Such an approach may be used for reducing or eliminating mode hops. In some embodiments, the laser has at least two control parameters for wavelength control and laser cavity length control. A wavelength discontinuity due to the mode hop may be reduced or eliminated by changing laser control parameters either before the mode hop, or at on following the mode hop. An important aspect of the analysis is that the correction to control parameters before (or after) the mode hop depends on values of the laser sweep performance monitoring device(s) 26 after (or before) the mode hop. The analysis and correction is therefore intrinsically non-linear and non-local within the sweep of laser control parameters, and this is not consistent with real-time control such as in U.S. Patent Application Publication 2009/0059972, discussed above.

Method for Calibrating Wavelength Sweeps of a Laser, any Laser

Figure 6:
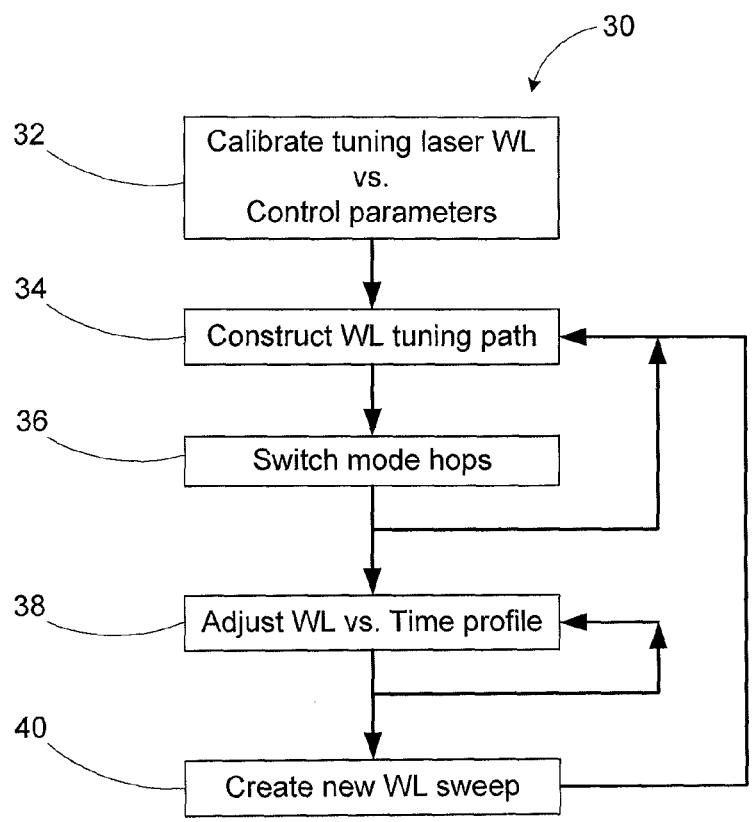
FIGS. 6-8 are exemplary methods in accordance with aspects of the present invention.

Another aspect of the invention is a method 30 of using the laser system 10, 20 to calibrate the sweep of the control parameters of a laser versus time, to adjust the parameters to prevent mode hops during the sweep, and to adjust the parameters between mode hops to produce a prescribed wavelength versus time profile. An overview of the method is illustrated in FIG. 6.

At block 32, a rough wavelength tuning path is measured with low wavelength resolution by adjusting the laser control parameter(s). As this step is performed once, typically, conventional wavelength measurement instruments such as an optical spectrum analyzer or wavelength meter may be used. The laser control parameters may be the angle of a grating or filter, or control currents to sections of an SMTLS.

At block 34, a very rough tuning path of wavelength versus control parameter(s) may be determined using the measured wavelength tuning map of block 32. The wavelength accuracy of the tuning path need only be for example +/−100 picometer.

At block 36, the laser control parameters are adjusted to reduce or eliminate the wavelength discontinuities due to mode hops. This process is referred to herein as stitching the mode hops in a wavelength sweep. Exemplary laser control parameters may include inputs to the laser source 12. Such inputs may include, for example, front mirror (FM) current, back mirror (BM) current, phase (P) current, gain (G) current, and semiconductor optical amplifier (SOA).

At block 38, the laser control parameters are adjusted to produce a prescribed wavelength versus time profile. The prescribed profile may take any desired form. For example, the wavelength versus time may be linear; the optical frequency versus time may be linear; prescribed sweep performance characteristics may be a non-linear relationship between wavelength and time in order to compensate for dispersion and/or propagation in a medium; the prescribed sweep performance characteristics may include a sweep of power versus time that is constant versus wavelength; the prescribed sweep performance characteristics include a sweep of power versus time that is Gaussian versus wavelength; the prescribed sweep performance characteristics emulate a Fast Fourier Transform windowing function; and the prescribed sweep performance characteristics compensate for optical system losses in frequency and/or wavelength.

At block 40, the laser control parameters are collected to produce a sweep of the laser wavelength. For example, the control parameters are applied in a desired manner to produce the prescribed sweep performance.

The method may benefit from repeating or iterating certain steps, individually or altogether. As illustrated by the flow path arrows in the FIG. 6, blocks 36, 38 and 40 may be iterated to improve the performance of the algorithm.

Method for Maintaining Wavelength Sweeps of a Laser, any Laser

Figure 7:
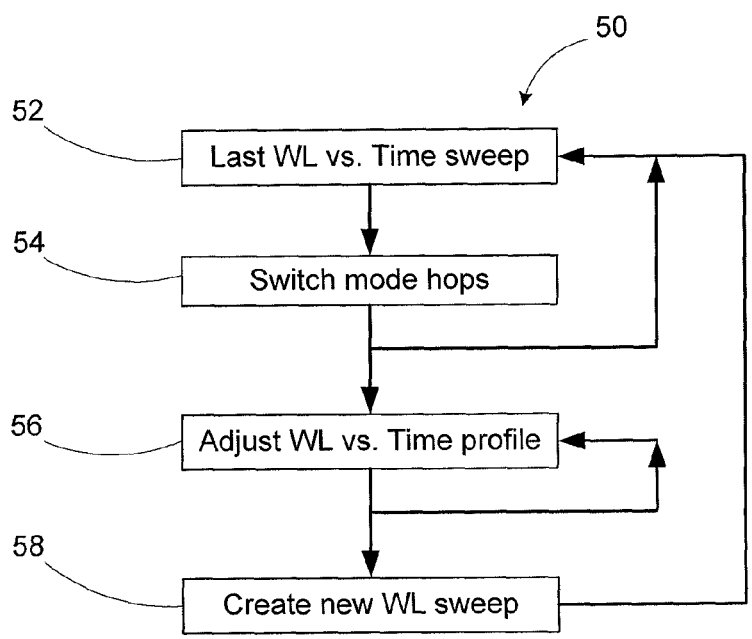

Another aspect of the invention is a method 50 using the laser system 10, 20 to maintain a laser sweep versus time with stitched wavelength discontinuities and a prescribed wavelength versus time, as illustrated in FIG. 7. At block 52, the last wavelength sweep of laser control parameters is performed. At block 54, the laser control parameters are adjusted to reduce or eliminate the wavelength discontinuities due to mode hops. At block 56, the laser control parameters are adjusted to produce a prescribed wavelength versus time profile. At block 58, the laser control parameters are collected to produce a sweep of the laser wavelength. The method 50 may benefit from repeating or iterating certain steps, individually or altogether. As illustrated by the signal path arrows in the FIG. 7, blocks 54, 56 and 58 may be iterated to improve the performance of the algorithm.

Detailed Embodiment, Method for Calibrating a Sweep of any Laser

Figure 8:
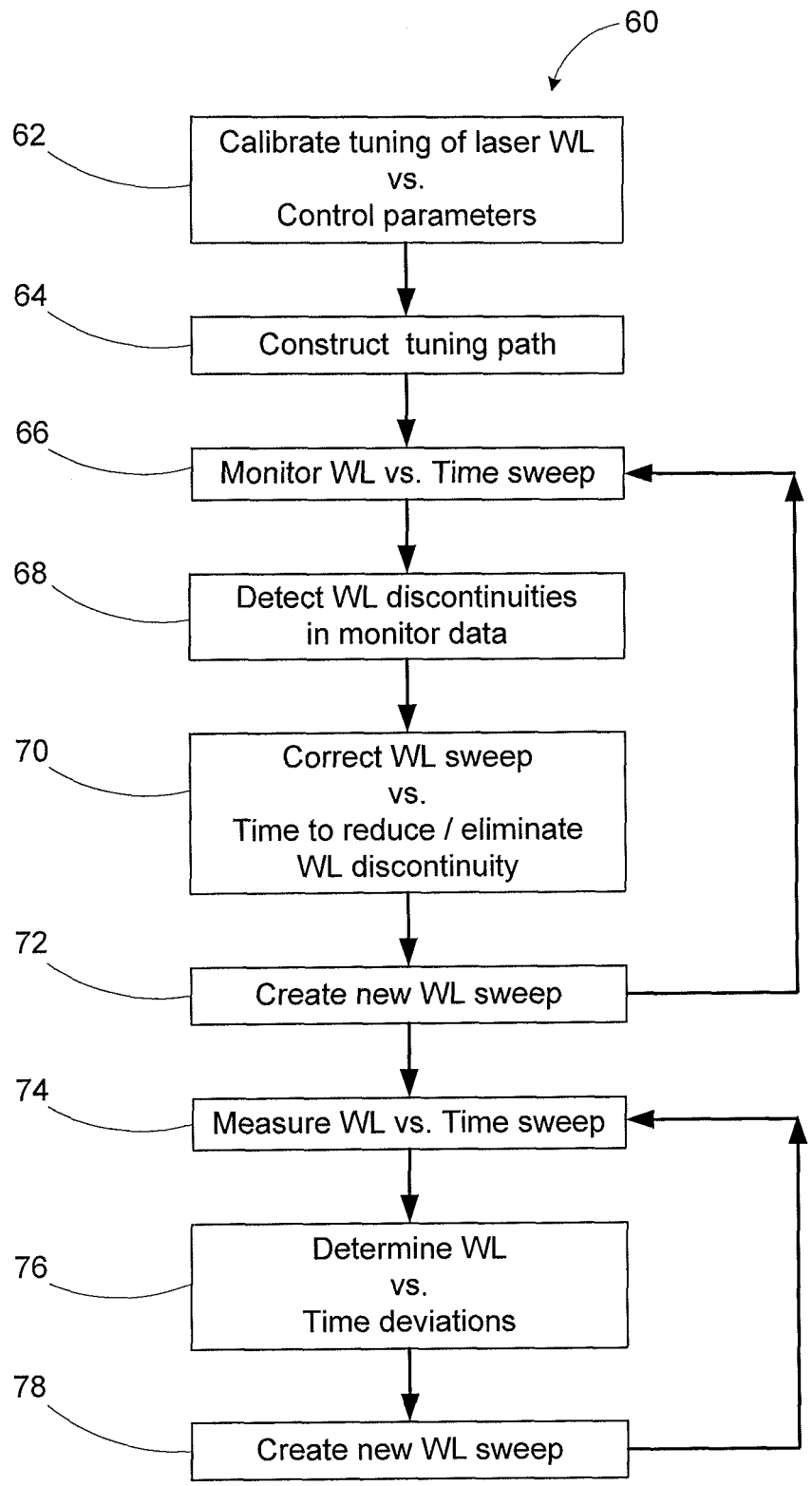

A method 60 for fully calibrating a sweep of wavelength versus time using calibrated laser control parameters is illustrated in FIG. 8.

At block 62, a rough wavelength tuning map is measured with low wavelength resolution by adjusting the laser control parameter(s). As this step is performed once, typically, conventional wavelength measurement instruments such as an optical spectrum analyzer or wavelength meter may be used. The laser control parameters may be the angle of a grating or filter, or spacing of a MEMs element, or control currents to sections of an SMTLS.

At block 64, a very rough tuning path of wavelength versus control parameter(s) may be determined using the measured wavelength tuning map of block 64. The wavelength accuracy of the tuning path need only be rough, for example +/−100 picometer.

Figure 9:
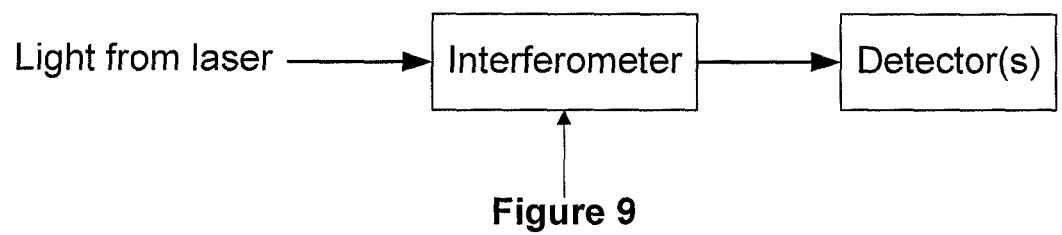
FIGS. 9-12 are exemplary systems in accordance with aspects of the present invention.

At block 66, the laser tuning parameter(s) are swept in time, producing a wavelength sweep of the laser versus time. The wavelength of the laser may be monitored with wavelength monitoring devices, such as one interferometer (FIG. 9); or two interferometers of different Free Spectral Range (FSR) (FIG. 10); or two interferometers of different FSR and a relative wavelength reference such as a temperature-stabilized etalon or temperature-stabilized Fiber Bragg Grating (FIG. 11); or two interferometers of different FSR and an absolute wavelength reference such as a gas absorption cell (FIG. 12).

Next, the method may reduce or eliminate wavelength discrepancies due to mode hops. At block 68, the processor analyzes signals that resulted from the wavelength monitoring devices to detect the points in the wavelength sweep when a wavelength discontinuity has occurred. The magnitude and direction of the wavelength discontinuity (either forward or backwards jump in wavelength) is determined from the monitored data.

At block 70, a processor determines the correction to one or more laser control parameters to reduce or eliminate the wavelength discontinuity. For example, the laser wavelength control parameter and laser cavity length control parameter may be adjusted. The wavelength discontinuity may be reduced or eliminated by changing laser control parameters either before the mode hop, or following the mode hop. An important aspect of the analysis is that the correction to control parameters before (after) the mode hop depends on values of the laser wavelength monitor devices after (before) the mode hop. The analysis and correction is therefore intrinsically non-linear and non-local within the sweep of laser control parameters.

At block 72, a new wavelength tuning path is constructed in which the laser control parameters are swept versus time to sweep the laser wavelength versus time with reduced or eliminated wavelength discontinuities (mode hops).

The process may be iterated, as shown by the signal path arrow from block 72 leading back to block 66, by running the new wavelength sweep and monitoring the wavelength versus time. The wavelength discontinuities may be identified and corrected for, progressively reducing or eliminating them with each loop. This iteration may be necessary due to the changing and non-linear relationships between excitation and response.

Next, the method 60 may adjust the wavelength sweep to correct it to the prescribed sweep of wavelength versus time. At block 74, the laser sweep is measured with the wavelength monitoring devices to determine the wavelength versus time profile.

At block 76, the processor analyzes the wavelength versus time data to determine deviations in the wavelength versus time profile from the prescribed profile. In one embodiment, the wavelength versus time measuring device may include a single interferometer with a FSR that is smaller than the wavelength sweep. The phase of the interferometer signal may be measured by calculating the Fourier Transform of the signal. The phase is proportional to the optical frequency of the laser; hence the phase versus time measures the optical frequency versus time. The measured optical frequency versus time signal is compared to a prescribed optical frequency versus time profile, and deviations are determined.

In another embodiment, the wavelength versus time measuring device may include a single interferometer with a FSR that is much smaller than the wavelength range of interest, 10-100 times smaller. The zero-crossings of fringes of the interferometer may be counted during the wavelength sweep, thereby recording the change of optical frequency versus time. Essentially, the interferometer with small FSR is measuring phase of the optical signal in units of ½ fringes, but the optical frequency of each fringe is small relative to the sweep range. The measured frequency versus time is compared to the prescribed frequency versus time, and deviations are determined.

In another embodiment, a single interferometer and a wavelength reference may include the wavelength device for measuring wavelength versus time. The interferometer may possess a small FSR, and measure optical frequency versus time as in the previous embodiment. Absolute wavelength features in the wavelength reference may be determined and their wavelengths measured. By determining the number of half-fringes of the interferometer between two or more known wavelength features, the optical frequency of the FSR may be measured for a sweep. Together, the interferometer and wavelength reference provide the absolute optical frequency versus time. The measured frequency versus time is compared to the prescribed frequency versus time, and deviations are determined.

At block 78, the processor converts the deviations in the sweep profile into changes to the laser control parameters to correct the wavelength versus time profile. An important aspect of the invention is to maintain the wavelength continuity achieved at the mode hops in previous steps, while also adjusting the wavelength sweep to achieve the prescribed profile.

The process may be iterated, as shown by the flow arrows from block 78 leading back to block 74, by running the new wavelength sweep and monitoring the wavelength versus time. The deviations of the wavelength versus time from the prescribed sweep may be identified and corrected for, progressively reducing or eliminating the wavelength versus time deviations with each iteration.

Detailed Embodiment, Method of Maintaining a Sweep of any Laser

Figure 13:
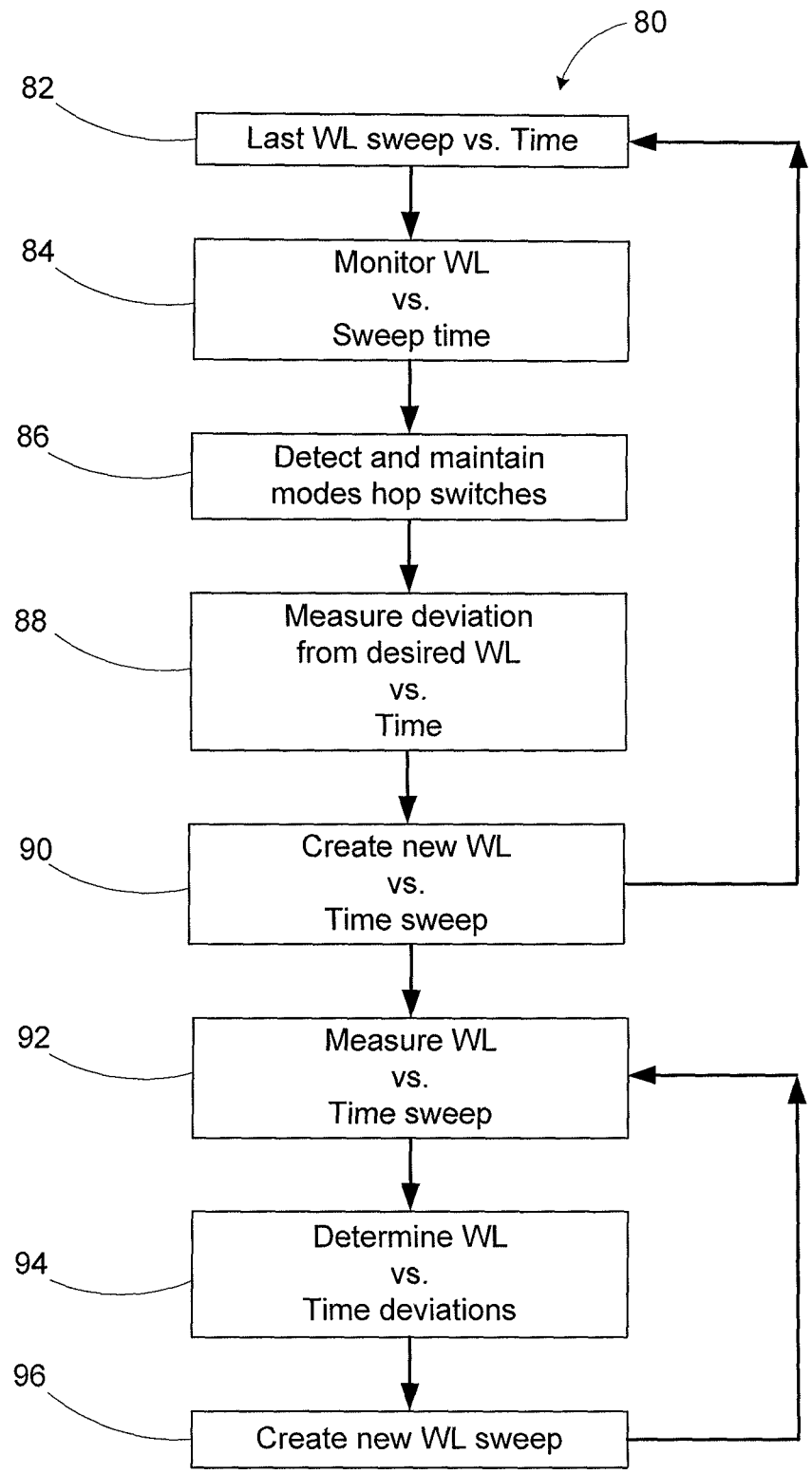
FIGS. 13-14 are exemplary methods in accordance with aspects of the present invention.

In another aspect of the invention, after the first laser tuning path is created, as described above, the laser 12 may be operated and periodically or occasionally the tuning path may be monitored and corrected. An embodiment of a periodic or occasional tuning path correction algorithm 80 is illustrated in FIG. 13.

At block 82, the process begins with sweeping the laser with the last wavelength tuning sweep.

At block 84, the laser tuning parameter(s) are swept in time, producing a wavelength sweep of the laser versus time. The wavelength of the laser may be monitored with wavelength monitoring devices as described above.

At block 86, the signal from the wavelength monitoring devices is analyzed to detect the points in the wavelength sweep when a wavelength discontinuity has occurred. The magnitude and direction of the wavelength discontinuity (either forward or backwards jump in wavelength) is determined from the monitor data.

At block 88, a processor determines the correction to one or more laser control parameters to reduce or eliminate the wavelength discontinuity. The wavelength discontinuity may be reduced or eliminated by changing laser control parameters either before the mode hop, or following the mode hop.

At block 90, a new wavelength tuning path is constructed in which the laser control parameters are swept versus time to sweep the laser wavelength versus time with reduced or eliminated wavelength discontinuities (mode hops).

The process may be iterated, as shown by the arrow from block 90 leading back to block 84, by running the new wavelength sweep and monitoring the wavelength versus time. The wavelength discontinuities may be identified and corrected for, progressively reducing or eliminating them with each loop.

At block 92, the laser sweep is measured with the wavelength monitoring devices to determine the wavelength versus time profile.

At block 94, the processor analyzes the wavelength versus time data to determine deviations in the wavelength versus time profile from the prescribed profile.

At block 96, the processor converts the deviations in the sweep profile into changes to the laser control parameters to correct the wavelength versus time profile. An important aspect of the invention is to maintain the wavelength continuity achieved at the mode hops in previous steps, while also adjusting the wavelength sweep to achieve the prescribed profile.

The process may be iterated, as shown by the arrow from block 96 leading back to block 92, by running the new wavelength sweep and monitoring the wavelength versus time. The deviations of the wavelength versus time from the prescribed sweep may be identified and corrected for, progressively reducing or eliminating the wavelength versus time deviations with each iteration.

Method for Calibrating a Wavelength Sweep of a SMTLS

Figure 14:
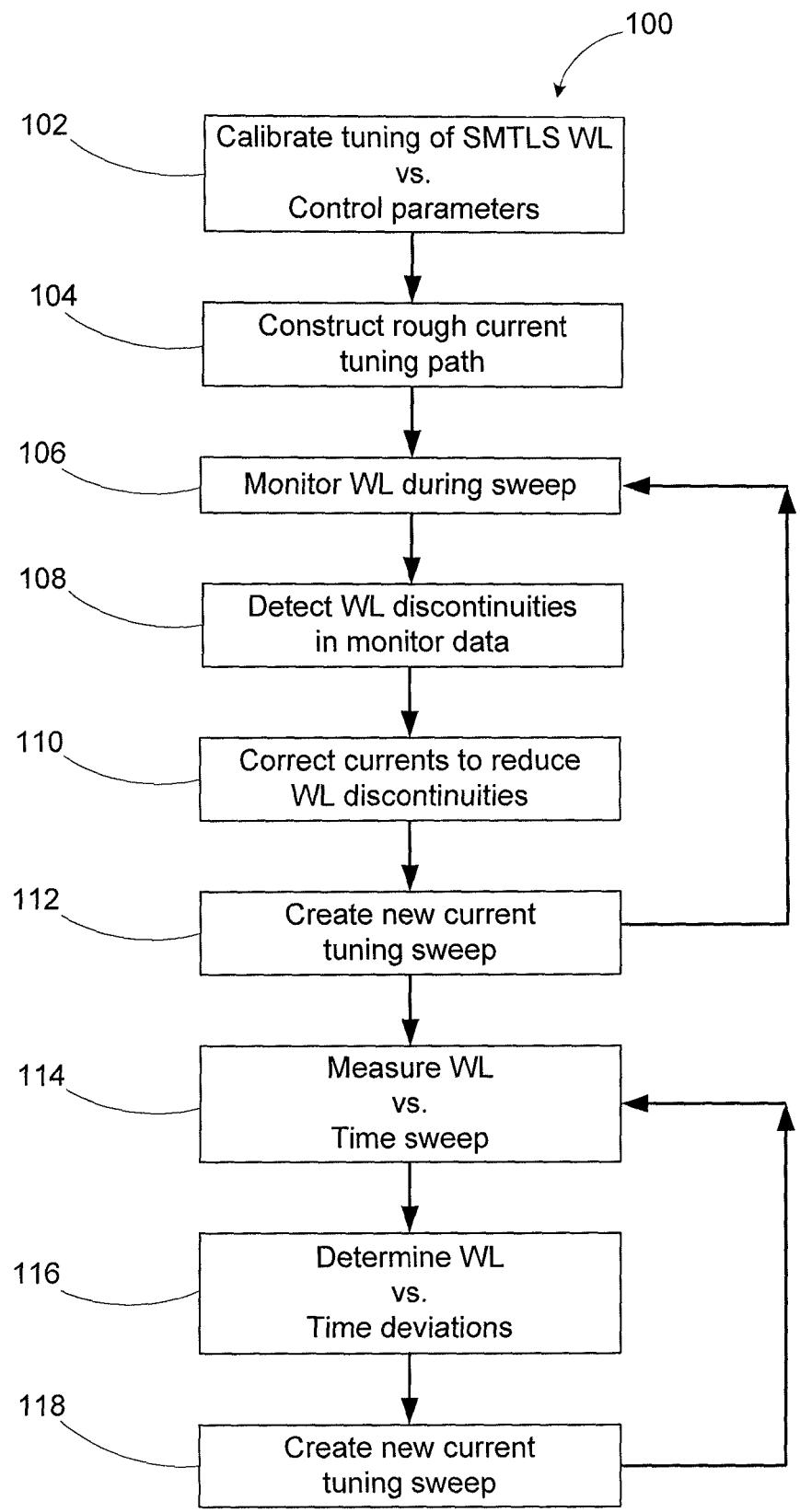

In a preferred embodiment of the invention, the laser may be an SMTLS such as an SGDBR laser. The method 100 to produce the first wavelength sweep of the SMTLS versus time with reduced or eliminated wavelength discontinuities is shown in FIG. 14.

At block 102, a very rough wavelength tuning path (using a coarse grid of control currents) is measured using any appropriate method, such as the Complete Absolute Wavelength Map, but done with very low wavelength resolution. The Complete Absolute Wavelength Map could be performed relatively quickly due to the low resolution, and will only be run once in the life of the SMTLS device. Instruments that may be used to measure the Map include an optical spectrum analyzer or a wavelength meter.

At block 104, a very rough current tuning path is determined through the Complete Absolute Wavelength Map measured at block 102. The rough current tuning path can be determined manually, or in an automated fashion. The wavelength accuracy of the tuning path need only be for example +/−100 pm.

Next, the wavelength sweep is measured to determine wavelength discontinuities and reduce or eliminate them.

At block 106, the very rough current tuning path is then executed, with the output being fed into a Relative/Absolute wavelength measurement circuit, such as in FIG. 12, consisting of (a) an absolute wavelength reference such as a Gas Cell with absorption lines covering a majority of the sweep wavelengths, (b) a Fast Mach-Zehnder (FMZ) interferometer with period smaller than ½ of the desired wavelength linearity (for example, 0.4 pm for a linearity of +/−1 pm), and (c) a Slow Mach-Zehnder (SMZ) interferometer. The SMZ should have an FSR greater than twice the typical mode hop for the SMTLS, for example 500 pm for an SMTLS with 350 pm mode hop distance. The FSR of the SMZ also should be a small percentage of the Path Segment Length (in nm).1, 2, 3 It should be noted that other types of interferometers, such as Michelson interferometers, are acceptable for use as the SMZ and FMZ, as known to those skilled in the art.

Figure 11:
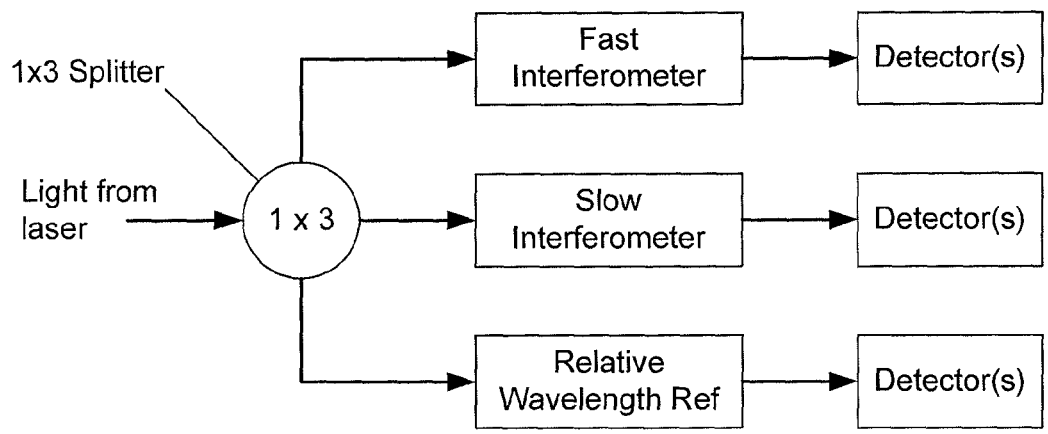
Figure 12:
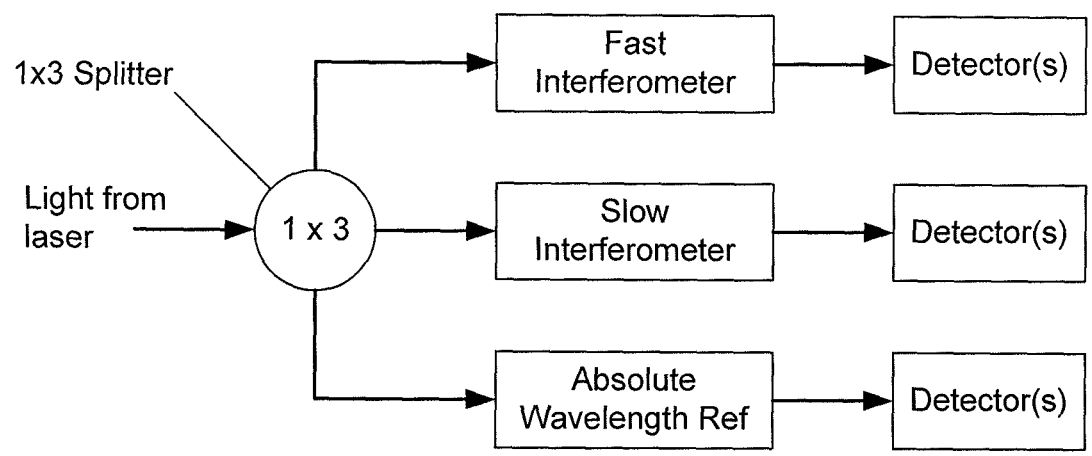

An alternative wavelength measurement device, shown in FIG. 11, may be used in embodiments of the invention where relative wavelength accuracy is required. The relative wavelength reference may be a temperature-stabilized etalon or a temperature-stabilized Fiber Bragg Grating. The accuracy of the relative reference is therefore dependent on the environmental stability of the reference.

Figure 10:
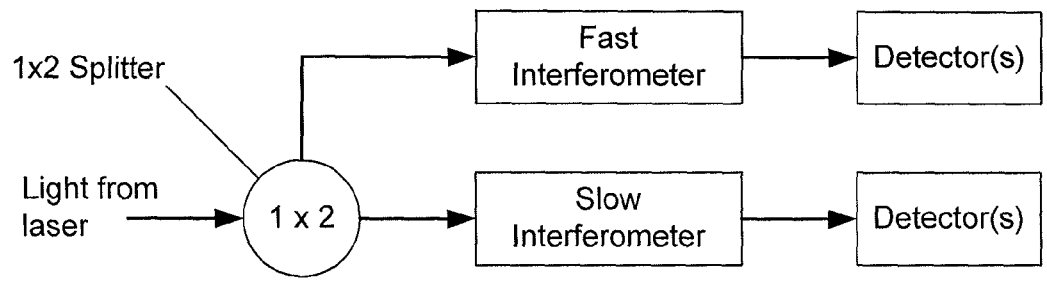

In another embodiment of the wavelength measurement device, if absolute wavelength information (start wavelength, stop wavelength, wavelength slope) are not important, then a device consisting of two interferometers of different FSRs shown in FIG. 10) may be used. The slow interferometer (with a large FSR compared to mode hops of the laser) may be used to identify wavelength discontinuities. The fast interferometer (with free spectral range (FSR) small compared to the desired linearity of the optical frequency of the sweep) may be used to measure the size of wavelength discontinuities. The fast interferometer also provides a linear optical frequency scale, with which the laser sweep may be linearized in optical frequency versus time or used as a reference to produce a desired profile of optical frequency versus time.

In yet another embodiment of the wavelength measurement device, a single interferometer may be used to detect wavelength discontinuities. The signal from the single interferometer may be analyzed with a processor. The processor performs a Fourier Transform on the signal to measure the phase of the interferometer signal versus time. See for example Yasuno et al, Optics Express vol. 13 10652 (2005). At locations in the sweep where a mode hop occurs, a large discontinuity in the phase will be detected. The phase discontinuity may be used and fed back to the control currents as described at blocks 108 and 110 below. The phase of the interferometer signal is also proportional to the optical frequency of the sweep. By mapping the optical frequency to the sweep timing indices, the laser's optical frequency vs. time profile can be adjusted by calculating the difference in phase of the interferometer signal from the desired phase at the time in the sweep. One possible adjustment is to adjust the laser control currents to produce a sweep of the laser optical frequency that is linear with time. Another possible sweep profile is to adjust the laser control currents to produce a sweep of the laser optical frequency that compensates for dispersion in the sample or reference arms of the end-user's interferometer that uses the sweep.

Figure 1A:
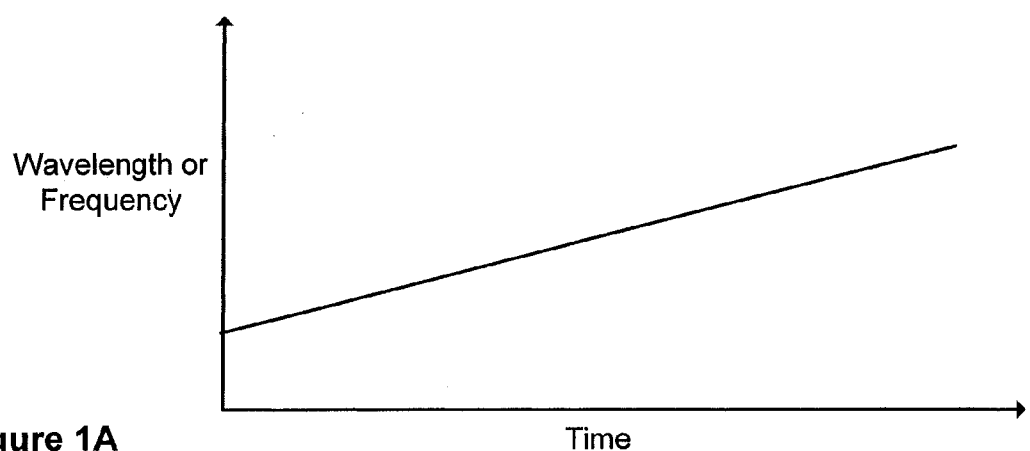
FIGS. 1A-1C are exemplary graphs of sweeps of a laser source plotted for frequency/wavelength versus time.
Figure 1B:
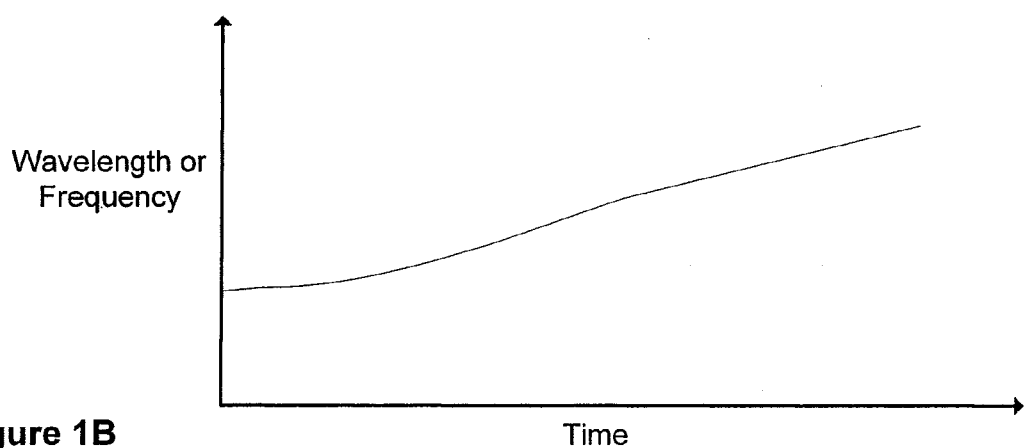
Figure 1C:
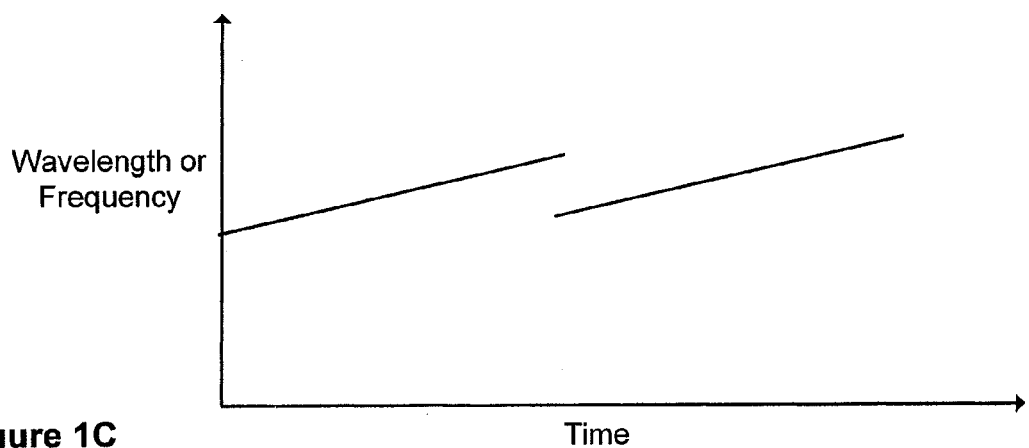
Figure 2:
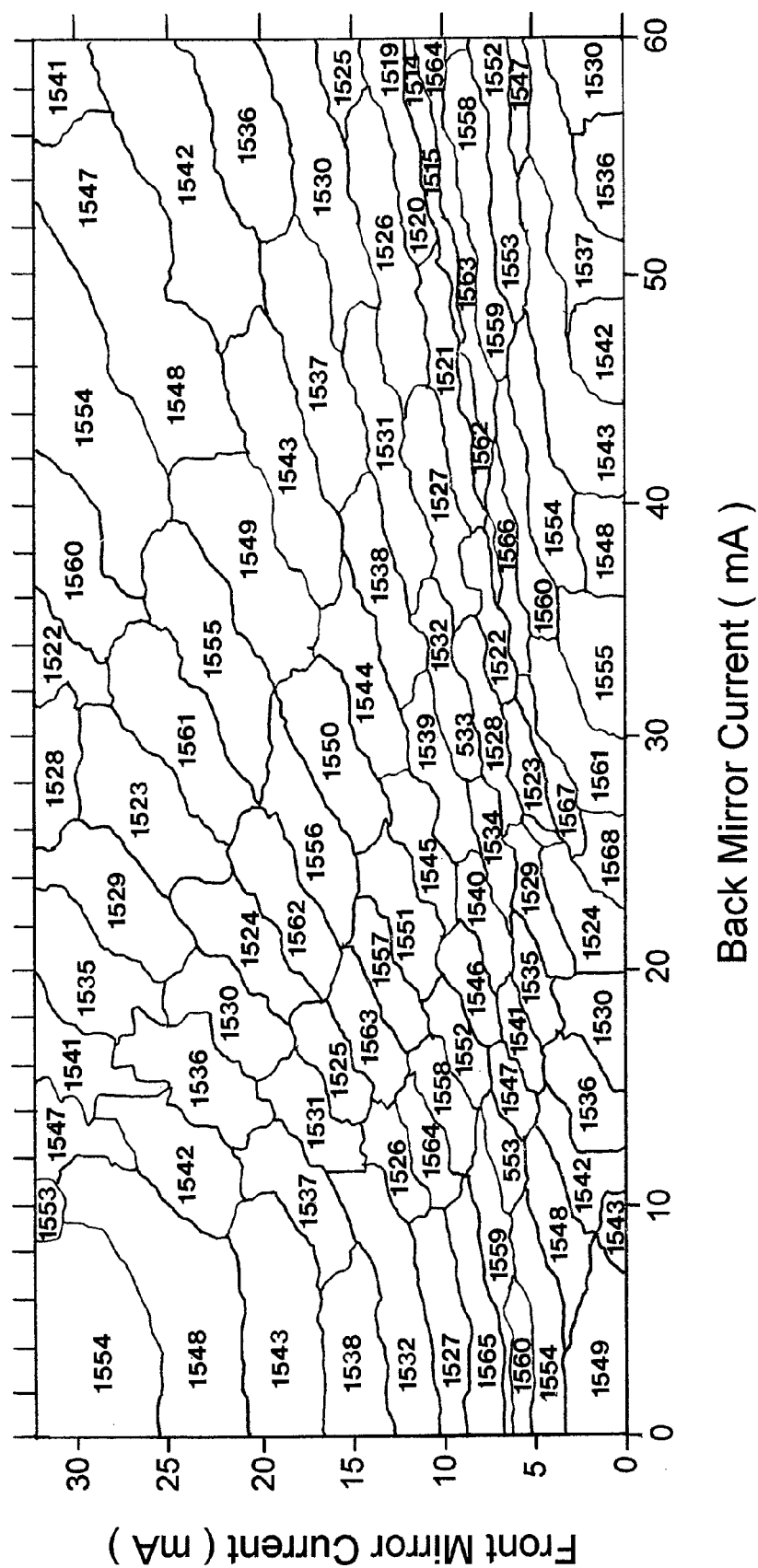
FIG. 2 is an exemplary chart of Tuning Map-Wavelength vs. Mirror Excitation with front mirror current (mA) versus back mirror current (mA).
Figure 3:
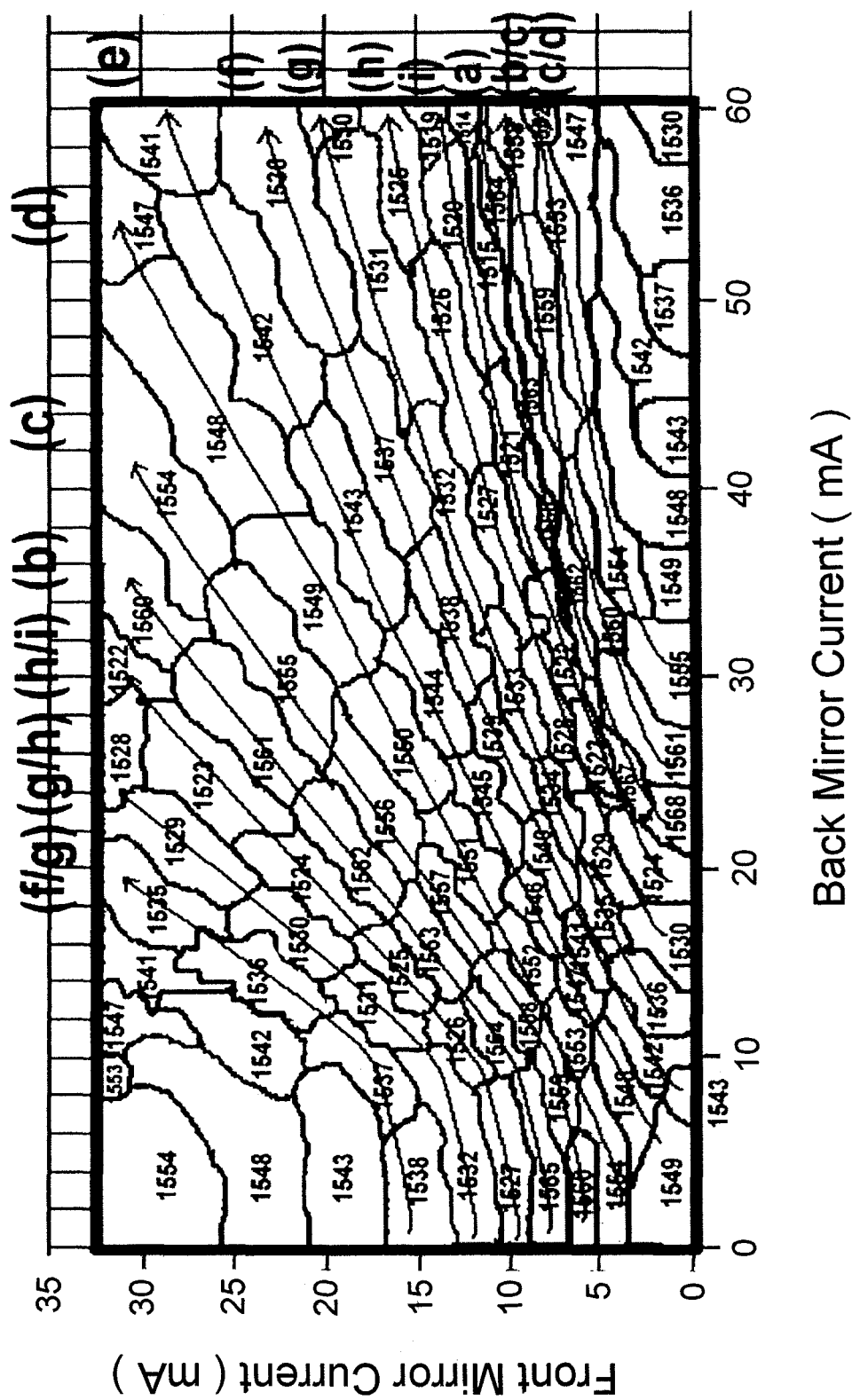
FIG. 3 is Tuning Map with Rough Mirror Sweep Paths plotted on the exemplary chart of FIG. 2.

At block 108, the signal from the SMZ is used to determine an appropriate transition-from point (TFP) for each path transition. Upon initial creation of the tuning path, the TFP is selected so that it is nearest the target point from block 104, and preferably the TFP is aligned with the peak of the first derivative of the SMZ signal. An advantage of using a SMTLS laser is that the control currents indicate where the TFP will occur in a sweep. For example, at the boundaries between modes in the wavelength map, or at the end of each tuning path in FIG. 3, the control currents change discontinuously and this corresponds to the times in the sweep when a wavelength discontinuity may occur from a mode hop.

Figure 15:
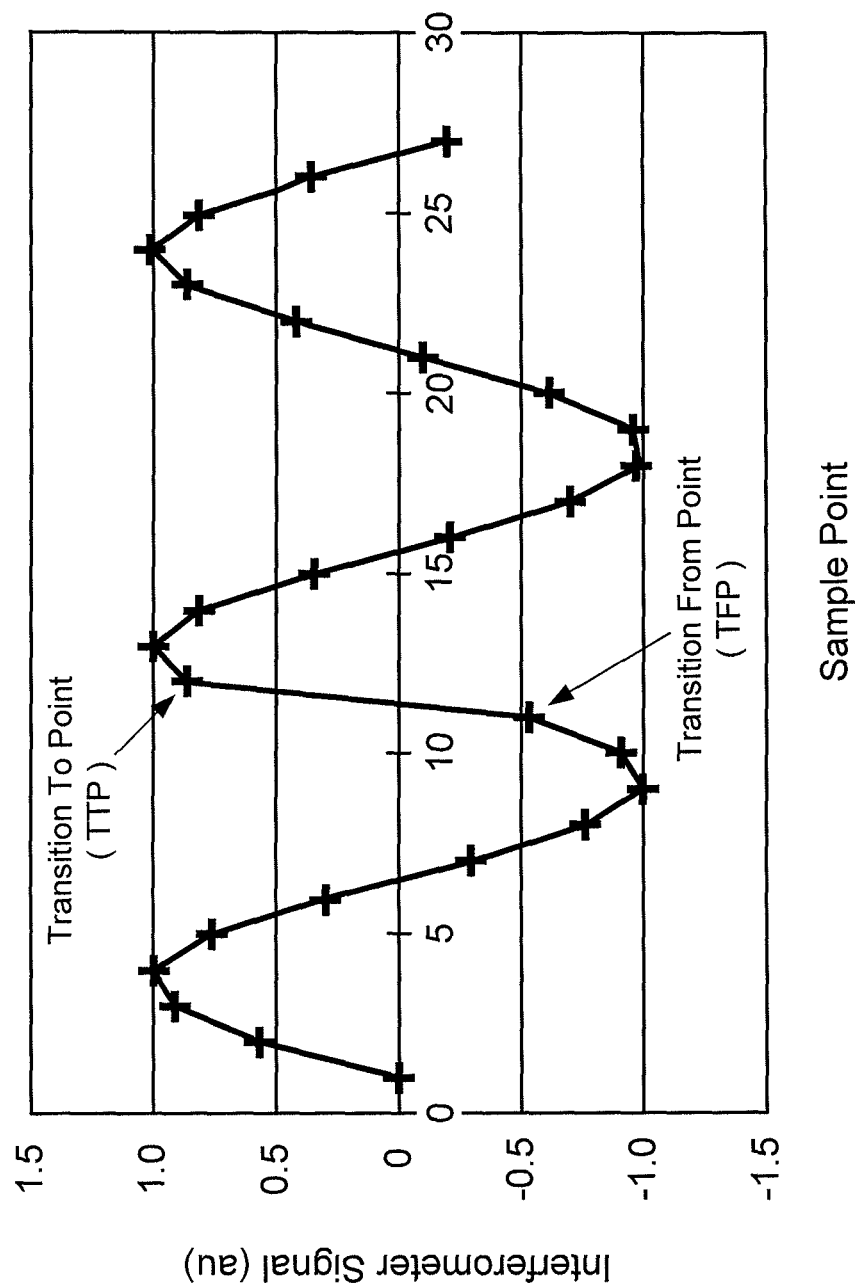
FIG. 15 is an exemplary SMZ signal, with a wavelength discontinuity due to a path transition.

Placing the TFP at or near the maximum of the first derivative of the SMZ ensures that the transition point is not in the flat area of the SMZ signal, where it might be difficult to determine the magnitude and direction of a wavelength discontinuity. Note that the TFP does not need to be the maximum slope of the SMZ, but this improves the ability to align with higher precision. An exemplary SMZ signal, with a wavelength discontinuity due to a path transition is shown in FIG. 15.

An alternative method of locating the TFP is to measure the phase of the SMZ signal. The phase of the SMZ signal may be determined by calculating the Fourier Transform of the SMZ signal versus time. The TFP point may be located at the point where a discontinuity in the phase signal occurs. An advantage of this method may be that the TFP may occur anywhere on the SMZ signal and not be preferred at the maximum derivative region.

At block 110, the Transition-To Point (TTP) for the current tuning path is determined by sweeping around the previous rough TTP to find a position where the value of the SMZ signal is identical to that at the TFP. This sweep could be predetermined, the outcome measured, and the ideal point determined from the time correlation of the excitation and the measurement.

Figure 16:
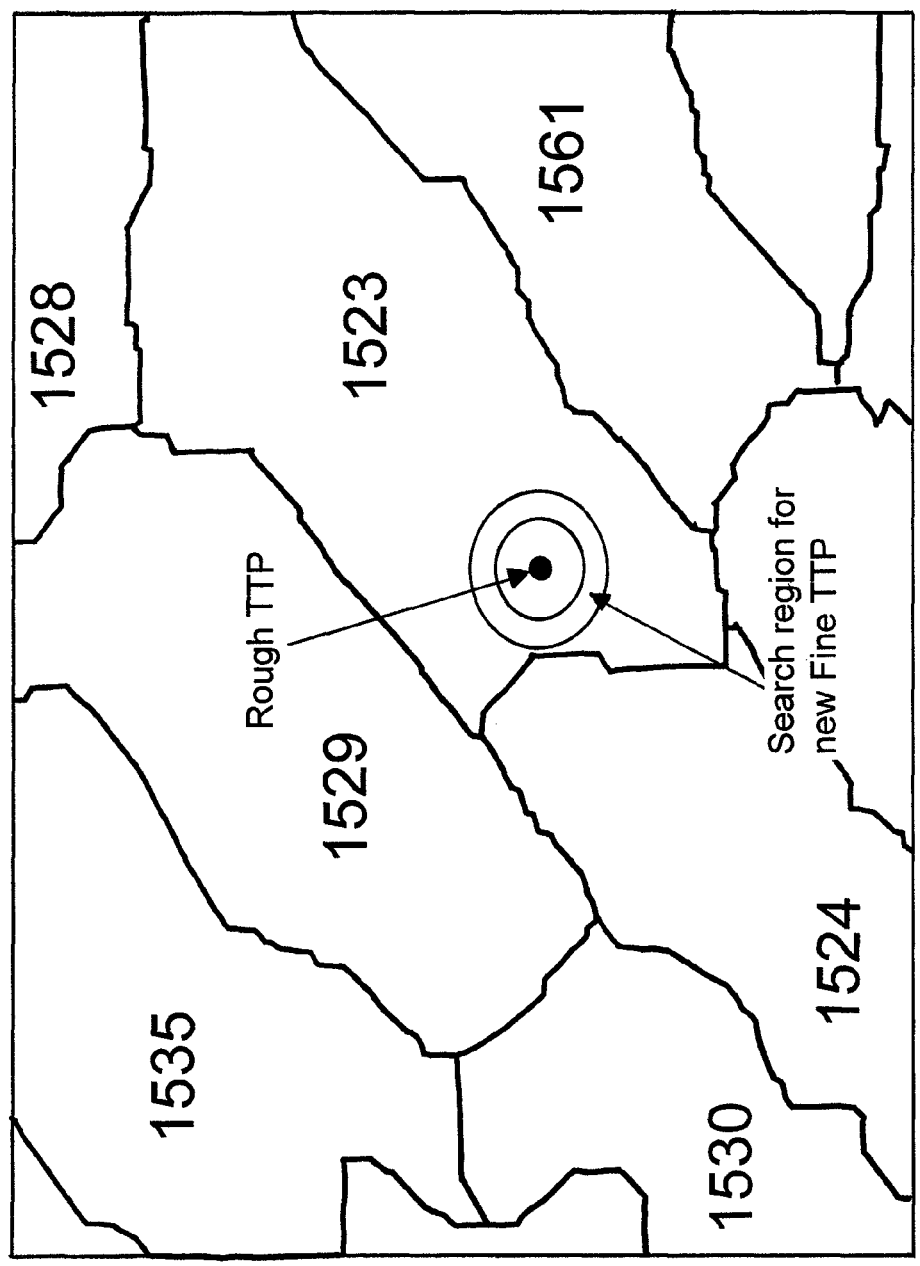
FIG. 16 is an exemplary wavelength map with fine tuning of Transition-To Point (TTP) region.

A preferred search algorithm for finding the TTP that matches the TFP is as follows. The finely adjusted TTP (Fine TTP) may be determined by calculating the approximate sensitivity of wavelength to the current tuning signals, calculating the approximate wavelength error at the Rough TTP, and searching in a "donut" around the Rough TTP with the midpoint of the donut being the current tuning signal difference associated with the approximate wavelength error, as illustrated in FIG. 16. The laser tuning parameters may be chosen such that the laser wavelength will spiral from the outer edge of the donut to the inner edge of the donut (or vice-versa), the spiral spacing determined by the desired maximum wavelength accuracy, and then the resulting data of this high speed sweep used to find the point where the SMZ signal most nearly matches the SMZ signal at the Fine TFP.

In a preferred searching method, the front mirror and back mirror currents of an SMTLS may be adjusted to produce the spiral search pattern described above. Once the mirror current search has concluded, the current to the phase section (phase current) may also be optimized. The phase section modifies the cavity length to maintain a nominal number of modes within the cavity. The effect of not having this set correctly will be a mode hop, which manifests itself as a (nearly) instantaneous jump in wavelength of approximately 350 pm. To determine these transitions, the optimized sweep with front and back mirror currents adjusted to reduce or eliminate the difference between TFP and TTP must be evaluated relative to adjustments of the phase current. The sweep is evaluated using the SMZ signal to identify the mode hops due to improperly adjusted phase section. The Phase current is then stepped at each of the wavelength discontinuities, to compensate for the mode hop and reduce or eliminate the difference between the TFP and TTP.

In another embodiment of the searching method, the front mirror, back mirror and phase current may be adjusted to produce the spiral search pattern. All three currents may be adjusted concurrently to reduce or eliminate the difference between the TFP and TTP, and thereby reduce or eliminate the wavelength discontinuity in the sweep.

Figure 17:
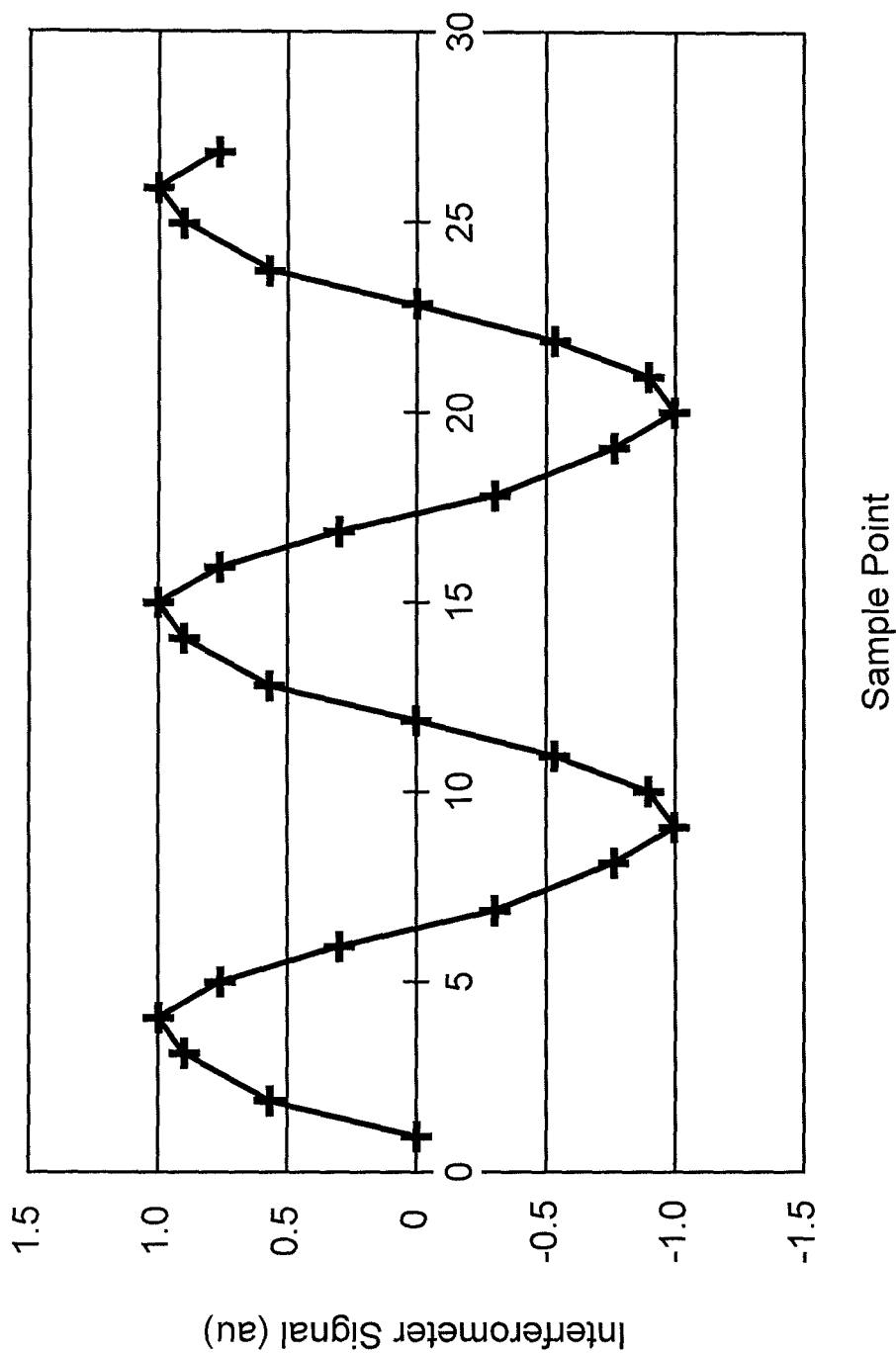
FIG. 17 is an SMZ signal with wavelength discontinuity of FIG. 15 eliminated.

The process at blocks 108 and 110 reduce or eliminate the wavelength discontinuities. FIG. 17 illustrates the result of successfully eliminating the difference between the TFP and TTP from FIG. 15. Blocks 108 and 110 are repeated for each segment of the wavelength tuning path. Because sweeping is very fast, this process can proceed and converge very rapidly.

At block 112, a new wavelength tuning path is constructed in which the laser control currents are swept versus time to sweep the laser wavelength versus time with reduced or eliminated wavelength discontinuities between the TFPs and the TTPs (mode hops).

The process may be iterated, as shown by the arrow from block 112 leading back to block 106, by running the new wavelength sweep and monitoring the wavelength versus time. The wavelength discontinuities may be identified and corrected for, progressively reducing or eliminating them with each loop.

Next, the wavelength versus time profile of the SMTLS may be measured and adjusted to match the prescribed wavelength sweep profile.

At block 114, the SMTLS sweep is measured with the wavelength monitoring devices to determine the wavelength versus time profile. The wavelength versus time profile may be measured via one of several embodiments of this invention. In one embodiment, the wavelength monitoring signal is generated from an interferometer with FSR smaller than the wavelength range, but larger than the wavelength scale of linearity, may be analyzed with a Fourier Transform. The phase of the signal versus time may be determined, as mentioned above, and the optical frequency versus time profile determined.

In another embodiment, the wavelength monitoring signal is generated from an interferometer with FSR less than or equal to the smallest wavelength scale of the prescribed wavelength versus time sweep. The fringes or half-fringes of the interferometer signal may be counted versus time. Each half-fringe corresponds to a precise optical frequency interval, and thus the optical frequency versus time is determined.

In another embodiment, a single interferometer and a wavelength reference may include the wavelength device for measuring wavelength versus time. The interferometer may possess a small FSR, and measure optical frequency versus time as in the previous embodiment. Absolute wavelength features in the wavelength reference may be determined and their wavelengths measured. By determining the number of half-fringes of the interferometer between two or more known wavelength features, the optical frequency of the FSR may be measured for a sweep. Together, the interferometer and wavelength reference provide the absolute optical frequency versus time. The measured frequency versus time is compared to the prescribed frequency versus time, and deviations are determined.

At block 116, the processor analyzes the wavelength versus time data to determine deviations in the wavelength versus time profile from the prescribed profile.

At block 118, the processor converts the deviations in the sweep profile into changes to the laser control parameters to correct the wavelength versus time profile. An important aspect of the invention is to maintain the wavelength continuity achieved at the TFP and TTPs in previous steps, while also adjusting the wavelength sweep to achieve the prescribed profile.

The process may be iterated, as shown by the arrow from block 118 leading back to block 114, by running the new wavelength sweep and monitoring the wavelength versus time. The deviations of the wavelength versus time from the prescribed sweep may be identified and corrected for, progressively reducing or eliminating the wavelength versus time deviations with each iteration.

Method of Maintaining the Wavelength Sweep of an SMTLS

Figure 18:
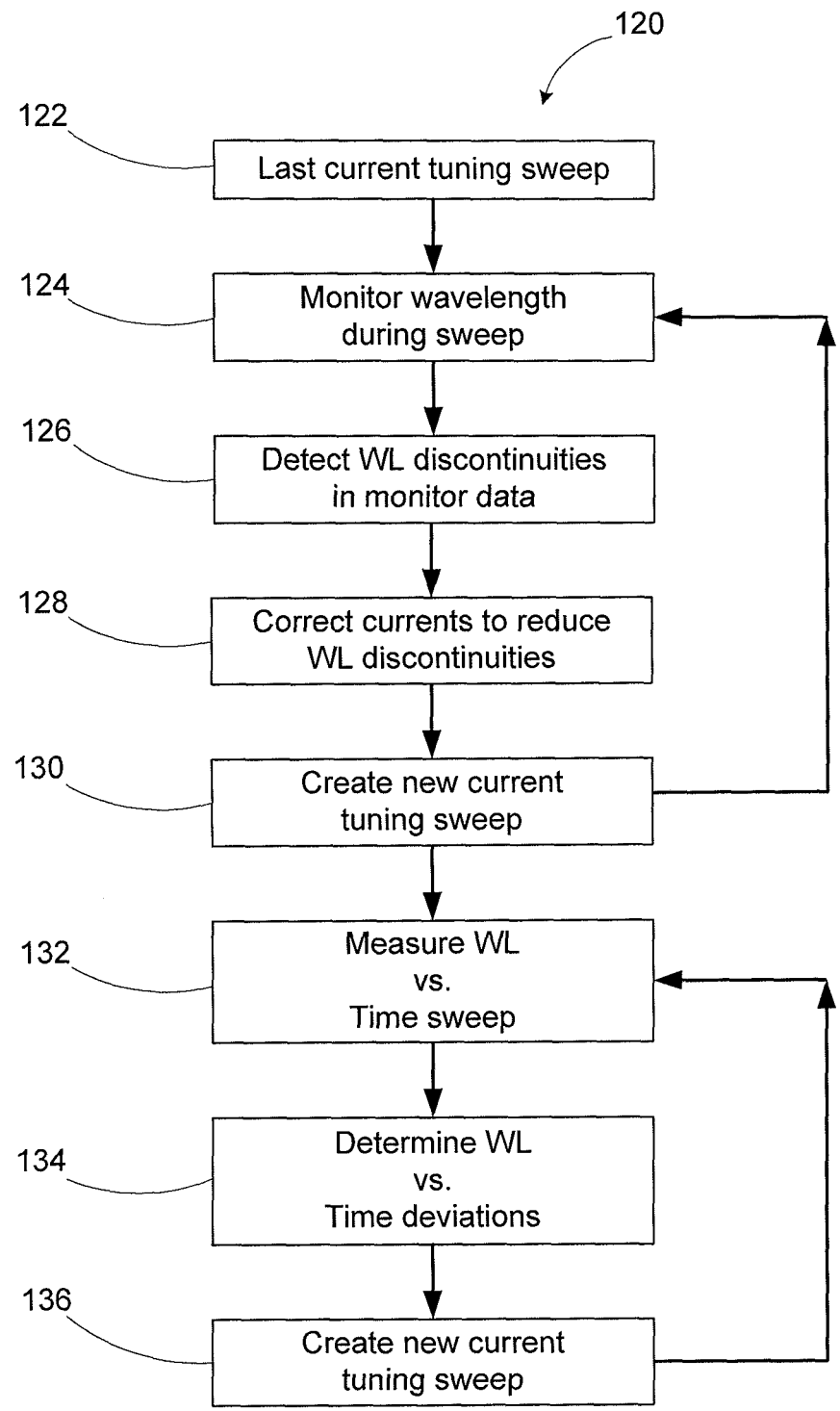
FIG. 18 is an exemplary method in accordance with aspects of the present invention.

In another aspect of the invention, the preceding steps can be repeated any time the laser is not required by the end-user, in the background, and these background activities can be terminated to allow rapid response to a request to perform a new user-desired sweep. The SMTLS may be operated and periodically or occasionally the tuning path may be monitored and corrected, as illustrated by method 120 in FIG. 18.

At block 122, a SMTLS monitor and control algorithm, the last laser current tuning path sweep is performed.

At block 124, the SMTLS current(s) are swept in time, producing a wavelength sweep of the SMTLS laser versus time. The wavelength of the SMTLS laser may be monitored with wavelength monitoring devices as described above.

At block 126, the signal from the wavelength monitoring devices is analyzed to detect the points in the wavelength sweep when a wavelength discontinuity has occurred. The magnitude and direction of the wavelength discontinuity (either forward or backwards jump in wavelength) is determined from the monitor data.

At block 128, a processor determines the correction to one or more laser control currents to reduce or eliminate the wavelength discontinuity. The wavelength discontinuity may be reduced or eliminated by changing laser control parameters either before the mode hop, or following the mode hop.

At block 130, a new wavelength tuning path is constructed in which the SMTLS control currents are swept versus time to sweep the SMTLS wavelength versus time with reduced or eliminated wavelength discontinuities (mode hops).

Blocks 124-139 may be iterated to reduce or eliminate the wavelength discontinuities in the wavelength sweep versus time.

Next, the wavelength versus time profile of the SMTLS may be measured and adjusted to match the prescribed wavelength sweep profile.

At block 132, the SMTLS sweep is measured with the wavelength monitoring devices to determine the wavelength versus time profile.

At block 134, the processor analyzes the wavelength versus time data to determine deviations in the wavelength versus time profile from the prescribed profile.

At block 136, the processor converts the deviations in the sweep profile into changes to the laser control parameters to correct the wavelength versus time profile. An important aspect of the invention is to maintain the wavelength continuity achieved at the TFP and TTPs in previous steps, while also adjusting the wavelength sweep to achieve the prescribed profile.

Blocks 132-136 may be iterated to reduce the deviations of the measured wavelength versus time profile from the prescribed profile, until the prescribed profile is achieved or the deviations remaining are below a specified tolerance.

It should be noted that the FMZ improves performance but is not necessary. Any periodic optical signal can be used instead of the SMZ. Alternatives to the gas cell include precision calibrated etalons, for example.

Calibrations may be accomplished with two or more sets of settings, then switched from one to another or interleaved very rapidly.

Illustrative embodiments of an invention are disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". It should also be noted that although the specification lists method steps occurring in a particular order, these steps may be executed in any order, or at the same time.

Although the invention is shown and described with respect to illustrative embodiments, it is evident that equivalents and modifications will occur to those persons skilled in the art upon the reading and understanding hereof. The present invention includes all such equivalents and modifications and is limited only by the scope of the claims if appended hereto.

What is claimed is:

1. A sweeping laser system comprising:
   a semiconductor laser source that is operable to discretely output radiation over a range of wavelengths in a radiation sweep along a number of wavelength points based on an input signal comprising a group of controlled parameters, wherein a timescale of a period of the radiation sweep is nanoseconds or microseconds and variations in uncontrolled parameters occurring during the sweep have a direct effect on the semiconductor laser source and the electromagnetic radiation output by the semiconductor laser source;
a laser control unit operatively coupled to the semiconductor laser source, wherein the semiconductor laser source is configured to receive the input signal from the laser control unit to discretely change the radiation over the range of wavelengths based on the input signal; and
a sweep performance monitoring device configured to detect data associated with at least one physical property associated with radiation over the range of wavelengths; and
a processor to configure the laser control unit to adjust the input signal to the semiconductor laser source at one or more points in the radiation sweep in order to:
achieve adherence to a set of prescribed sweep performance characteristics; and
compensate for the effect of the uncontrolled parameters on the semiconductor laser source and the outputted electromagnetic radiation;
wherein each point in the one or more points is adjusted utilizing a plurality of points from any portion in the radiation sweep and the sweep performance monitoring device is coupled to the processor.

2. The sweeping laser system of claim 1, wherein the at least one physical property is at least one selected from a group consisting of wavelength, optical power, side mode suppression ratio, and phase.

3. The sweeping laser system of claim 1, wherein the performance monitoring device includes at least one selected from a group consisting of a wavelength monitoring device, an optical power monitoring device, a phase monitoring device, a voltage monitoring device and a current monitoring device.

4. The sweeping laser system of claim 1, wherein the performance monitoring device includes an optical power monitor for measuring optical power versus wavelength or side mode suppression ratio.

5. The sweeping laser system of claim 1, wherein the processor is configured to adjust the input signal in order to:
minimize wavelength discontinuities over the range of wavelengths; or
remove wavelength discontinuities over the range of wavelengths.

6. The sweeping laser device of claim 1, wherein the processor is configured to reduce the magnitude of wavelength change of the laser when the laser tunes from one single longitudinal mode to another single longitudinal mode.

7. The sweeping laser system of claim 1, wherein the prescribed sweep performance characteristics include a linear relationship between wavelength and time.

8. The sweeping laser system of claim 1, wherein the prescribed sweep performance characteristics include a linear relationship between optical frequency and time.

9. The sweeping laser system of claim 1, wherein the prescribed sweep performance characteristics include a non-linear relationship between wavelength and time in order to compensate for effects in a medium.

10. The sweeping laser system of claim 1, wherein the prescribed sweep performance characteristics include a sweep of power versus time that is constant versus wavelength.

11. The sweeping laser system of claim 1, wherein the prescribed sweep performance characteristics include a sweep of power versus time that is Gaussian versus wavelength.

12. The sweeping laser system of claim 1, wherein the prescribed sweep performance characteristics emulate a Fast Fourier Transform windowing function.

13. The sweeping laser system of claim 1, wherein the prescribed sweep performance characteristics compensate for optical system losses of frequency and/or wavelength.

14. The sweeping laser system of claim 1, wherein an updated radiation sweep is generated by the semiconductor laser source according to the adjusted input signal.

15. The sweeping laser system of claim 1, wherein the uncontrolled parameters are dynamic and vary with time.

16. The sweeping laser system of claim 15, wherein temperature is one of the dynamic uncontrolled parameters and the controlled parameters of the input signal are adjusted in order to compensate for an effect of temperature on the outputted radiation.

17. The sweeping laser system of claim 1, wherein the period of the radiation sweep is in the range of 1 nanosecond to 999 microseconds.

18. A method for controlling a semiconductor laser source to output radiation over a range of wavelengths, the method comprising:
outputting radiation from a semiconductor laser source over the range of wavelengths in a radiation sweep along a number of wavelength points based on an input signal to discretely change the radiation over the range of wavelengths comprising a group of controlled parameters, wherein a timescale of a period of the radiation sweep is nanoseconds or microseconds and uncontrolled parameters occurring during the sweep have a direct effect on the semiconductor laser source and the electromagnetic radiation output by the semiconductor laser source;
detecting data associated with at least one physical property associated with the radiation over the range of wavelengths;
processing the data to adjust the input signal to the semiconductor laser source at one or more points in the radiation sweep in order to:
achieve adherence to a set of prescribed sweep performance characteristics; and
compensate for the effect of the uncontrolled parameters on the semiconductor laser source and the outputted electromagnetic radiation;
wherein each point in the one or more points is adjusted utilizing a plurality of points from any portion in the radiation sweep.

19. The method of claim 18, wherein the data is processed to adjust the input signal in order to:
minimize a number of wavelength discontinuities over the range of wavelengths; or
remove wavelength discontinuities over the range of wavelengths.

20. The method of claim 19, further including tuning the laser in a constant single longitudinal mode.

21. The method of claim 18, wherein the data is processed to reduce a wavelength magnitude change of the semiconductor laser source when the laser tunes from one single longitudinal mode to another single longitudinal mode.

22. The method of claim 18, wherein an updated radiation sweep is generated by the semiconductor laser source according to the adjusted input signal.

23. The method of claim 18, wherein the period of the radiation sweep is in the range of 1 nanosecond to 999 microseconds.

24. A sweeping laser system comprising:
tuning mechanisms comprising a wavelength tuning mechanism and a laser path length tuning mechanism, wherein the tuning mechanisms are configured to operate a semiconductor laser source to discretely output radiation over a range of wavelengths in a radiation sweep along a number of wavelength points according to an input signal from the tuning mechanisms comprising a group of controlled parameters, wherein:
- a timescale of a period of the radiation sweep is nanoseconds or microseconds;
- uncontrolled parameters occurring during the sweep have a direct effect on the semiconductor laser source and the electromagnetic radiation output by the semiconductor laser source; and
- a first wavelength to a second wavelength in the range of wavelengths is separated by greater than one mode of the laser cavity;

one or more wavelength monitoring devices configured to detect data associated with at least one physical property associated with radiation over the range of wavelengths; and
a processor coupled to the one or more wavelength monitoring devices and the tuning mechanisms, wherein the processor analyzes the data from the wavelength monitor and is configured to:
- adjust the input signal from the tuning mechanisms at one or more points in the radiation sweep to reduce wavelength discontinuities in the radiation sweep; and
- compensate for the effect of the uncontrolled parameters on the semiconductor laser source and the outputted electromagnetic radiation;

wherein each point in the one or more points is adjusted utilizing a plurality of points from any portion in the radiation sweep.

25. The system of claim 24, wherein the laser source is configured to operate in a single-longitudinal mode of the cavity over an entire wavelength range of the laser source.

26. The system of claim 25, wherein the laser source comprises of a Sampled Grating Distributed Bragg Reflector (SGDBR) laser.

27. The system of claim 25, wherein the laser source comprises a Vertical Cavity Surface Emitting Laser (VCSEL).

28. The system of claim 25 further including a gain medium and an adjustable cavity external to the gain medium operably coupled to the laser source.

29. The system of claim 24, wherein the one or more wavelength monitoring devices includes an interferometer and an optical intensity detector of light transmitted or reflected from the interferometer.

30. The system of claim 24, wherein the one or more wavelength monitoring devices includes two interferometers of different free spectral ranges.

31. The system of claim 24, wherein the one or more wavelength monitoring devices includes at least one of a temperature-stabilized etalon, a temperature-stabilized Fiber Bragg Grating, or a gas cell.

32. The sweeping laser system of claim 24, wherein an updated radiation sweep is generated by the semiconductor laser source according to the adjusted input signal.

33. The system of claim 24, wherein the period of the radiation sweep is in the range of 1 nanosecond to 999 microseconds.

34. A method for reducing the wavelength discontinuities in a radiation sweep of a tunable laser from a start wavelength to a stop wavelength, the method comprising:
tuning a laser using an input signal to sweep the laser over a range of wavelengths from an initial wavelength to a final wavelength in the radiation sweep along a number of wavelength points based on an input signal to discretely change the radiation over the range of wavelengths comprising a group of controlled parameters, wherein a timescale of a period of the radiation sweep is nanoseconds or microseconds and uncontrolled parameters occurring during the sweep have a direct effect on the semiconductor laser source and the electromagnetic radiation output by the semiconductor laser source;
measuring data associated with at least one physical property over the range of wavelengths with at least one wavelength measurement device;
coupling the data from the at least one wavelength measurement device to a processor; and
processing the data to:
- adjust the input signal at one or more points in the radiation sweep to achieve adherence to a set of prescribed sweep performance characteristics; and
- compensate for the effect of the uncontrolled parameters on the semiconductor laser source and the outputted electromagnetic radiation;

wherein each point in the one or more points is adjusted utilizing a plurality of points from any portion in the radiation sweep.

35. The method of claim 34, wherein the data is processed to adjust the input signal to the tunable laser in order to remove wavelength discontinuities.

36. The method of claim 34, wherein an updated radiation sweep is generated by the tunable laser according to the adjusted input signal.

37. The method of claim 34, wherein the period of the radiation sweep is in the range of 1 nanosecond to 999 microseconds.

* * * * *